(12) United States Patent
Katayama et al.

(10) Patent No.: US 6,267,648 B1
(45) Date of Patent: Jul. 31, 2001

(54) APPARATUS AND METHOD FOR CHAMFERING WAFER

(75) Inventors: Ichiro Katayama; Masatami Iwaki; Kazumi Ikeda, all of Mitaka (JP)

(73) Assignee: Tokyo Seimitsu Co. Ltd., Tokyo (JP)

( * ) Notice: Subject to any disclaimer, the term of this patent is extended or adjusted under 35 U.S.C. 154(b) by 0 days.

(21) Appl. No.: 09/311,567

(22) Filed: May 14, 1999

(30) Foreign Application Priority Data

May 18, 1998 (JP) .................................................. 10-135257
May 18, 1998 (JP) .................................................. 10-135258
Oct. 28, 1998 (JP) .................................................. 10-307148

(51) Int. Cl.[7] ........................................................ B24B 1/00
(52) U.S. Cl. ................................. 451/44; 451/41; 451/43
(58) Field of Search .................................. 451/41, 43, 44

(56) References Cited

U.S. PATENT DOCUMENTS 5,476,413 * 12/1995 Hasegawa et al. .
5,595,522 * 1/1997 Simpson et al. .
5,727,990 * 3/1998 Hasegawa et al. .
6,045,436 * 4/2000 Rieger et al. .

FOREIGN PATENT DOCUMENTS

| 64-51912 | 2/1989 | (JP) . |
|---|---|---|
| 2-24047 | 1/1990 | (JP) . |
| 2-95554 | 4/1990 | (JP) . |
| 3-117546 | 5/1991 | (JP) . |
| 6-315857 | 11/1994 | (JP) . |
| 7-205001 | 5/1995 | (JP) . |
| 8-150551 | 6/1996 | (JP) . |
| 9-131654 | 5/1997 | (JP) . |
| 10-71549 | 3/1998 | (JP) . |

* cited by examiner

Primary Examiner—Timothy V. Eley
Assistant Examiner—Willie Berry, Jr.
(74) Attorney, Agent, or Firm—Nixon Peabody LLP; David S. Safran

(57) ABSTRACT

A grindstone and a wafer are rotated at high speeds in the same direction. The rotating wafer is slowly moved toward the rotating grindstone to thereby gradually chamfer the periphery of the wafer.

21 Claims, 24 Drawing Sheets

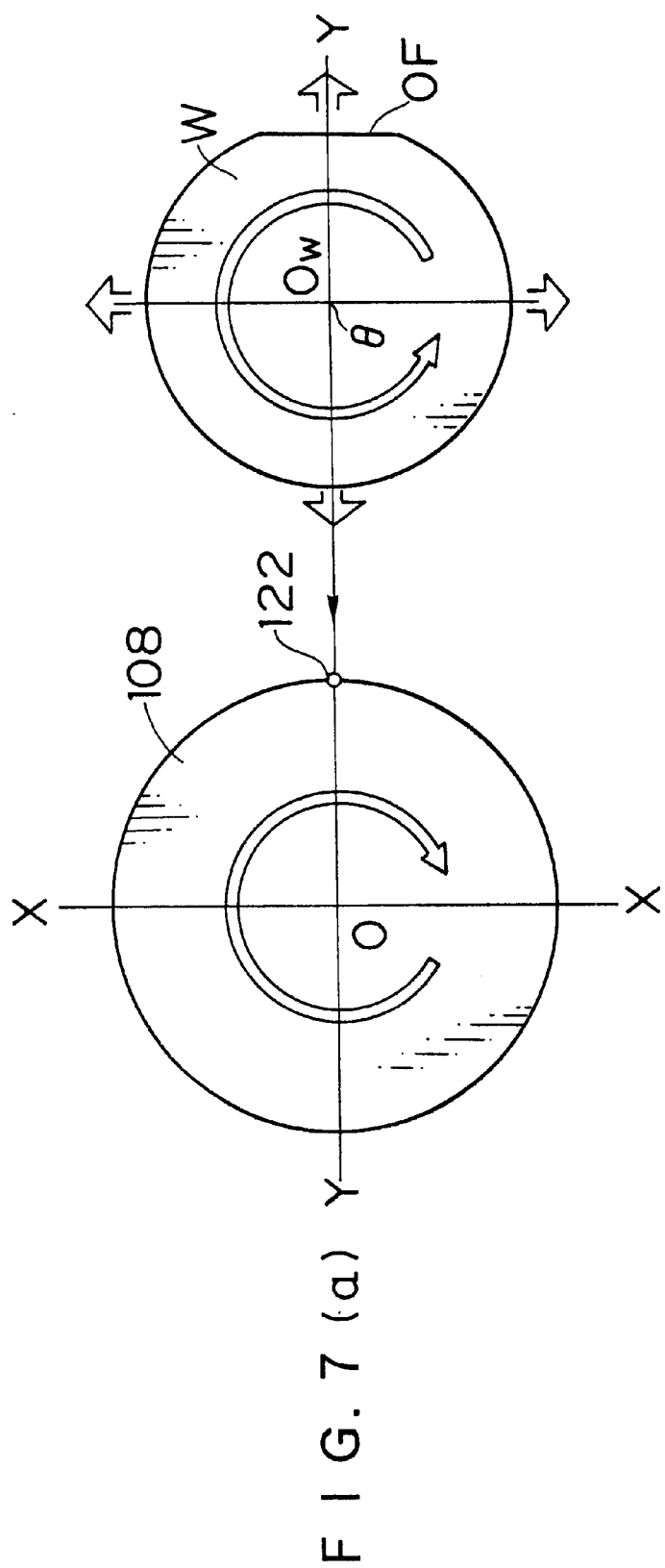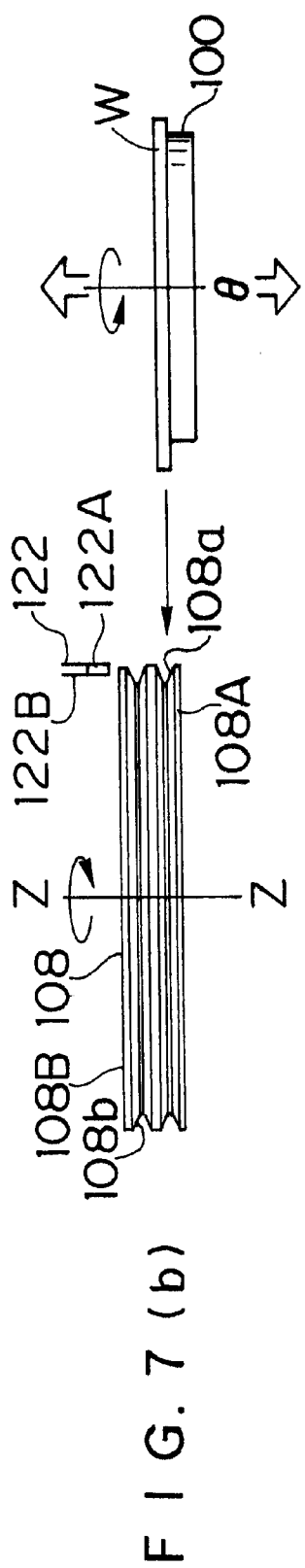
F I G. 7(a)
F I G. 7(b)

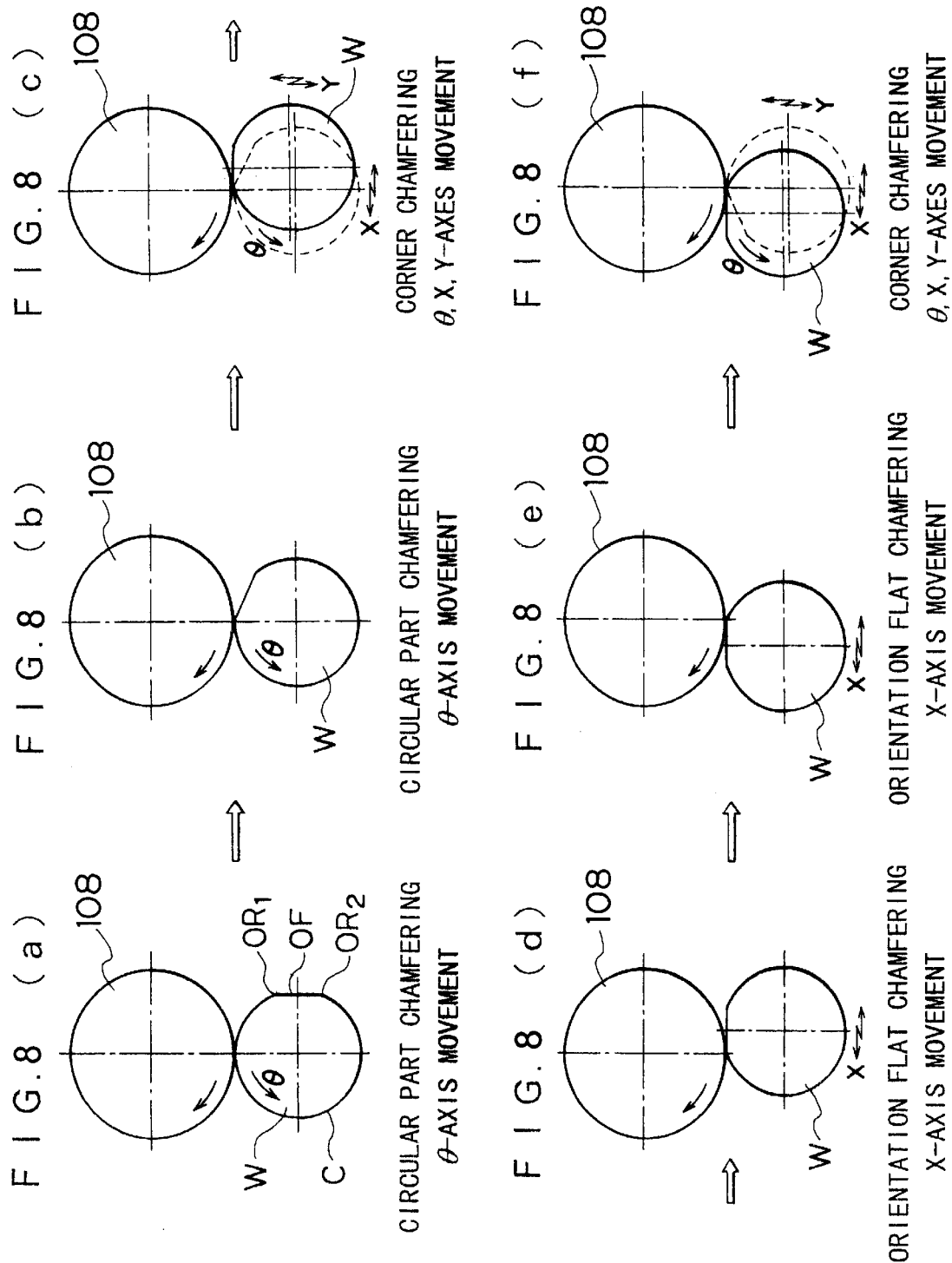

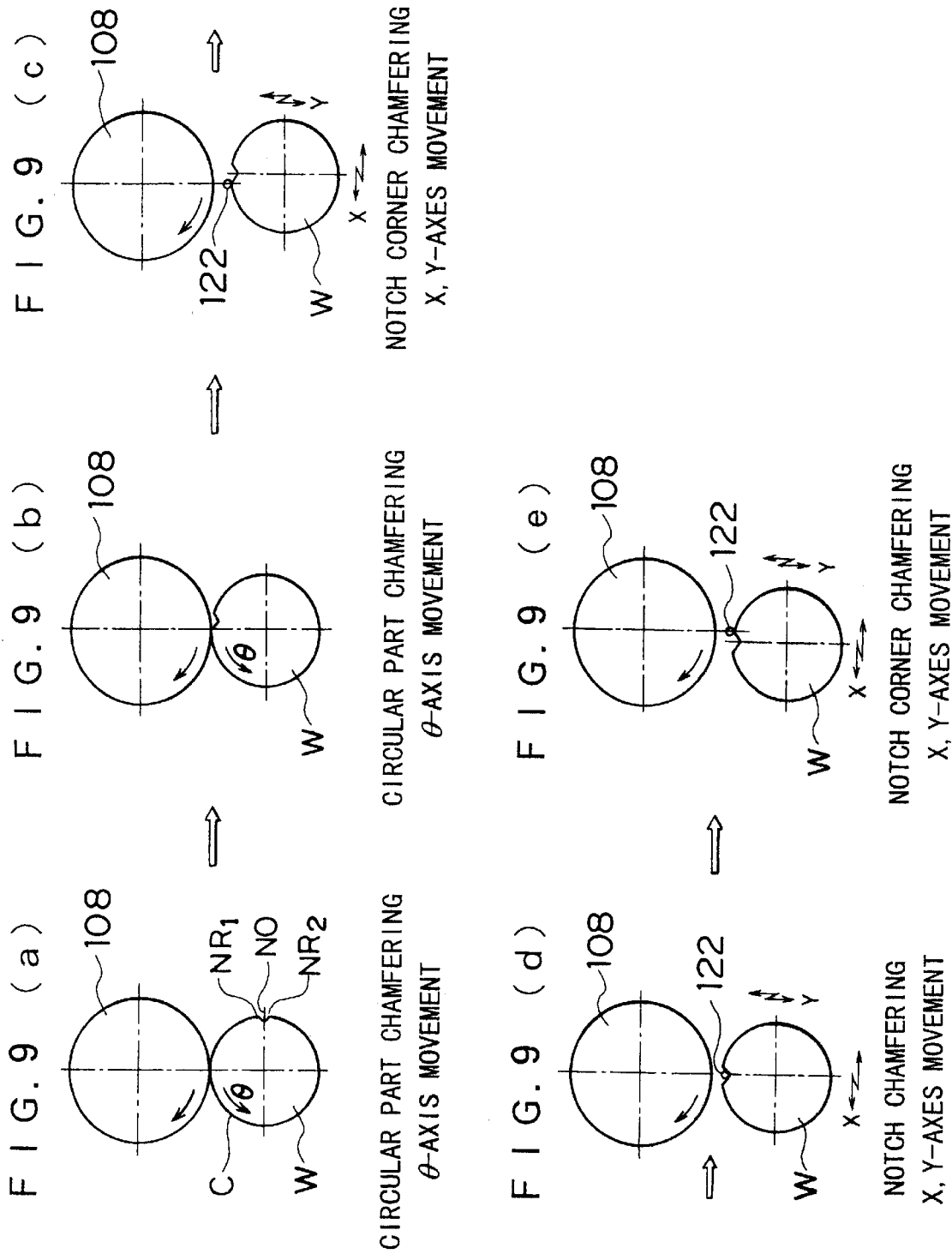

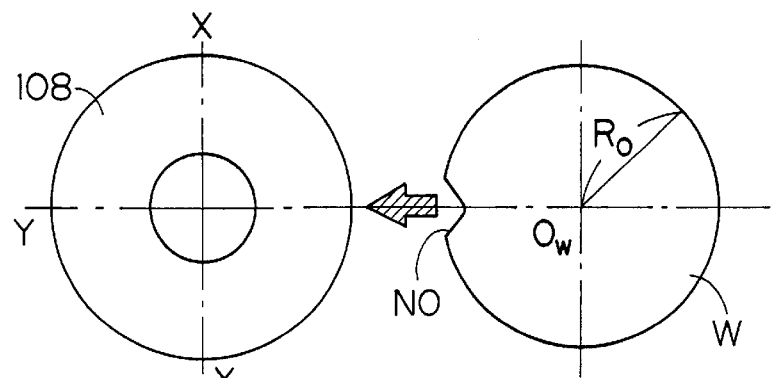
F I G. 11 (a)
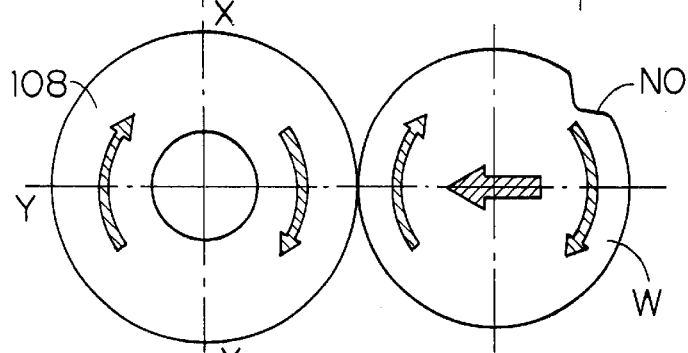
F I G. 11 (b)
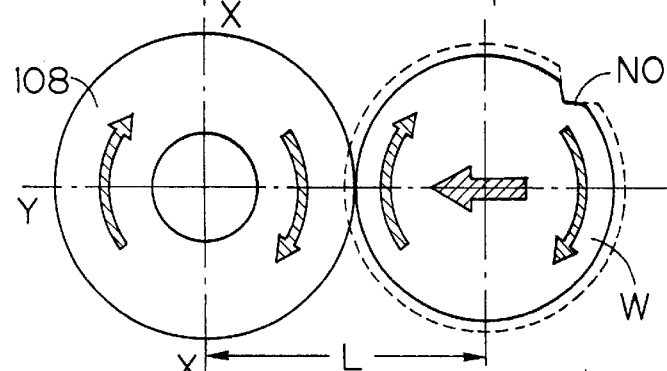
F I G. 11 (c)
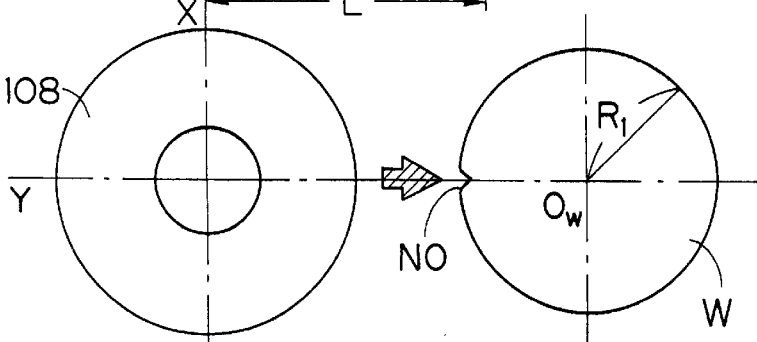
F I G. 11 (d)

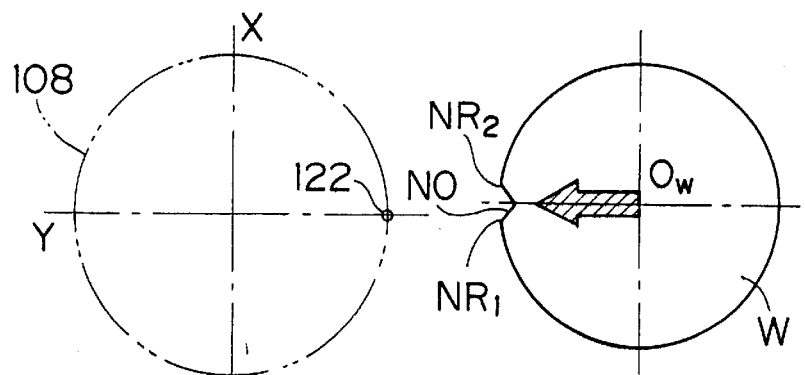
F I G. 1 2 (a)
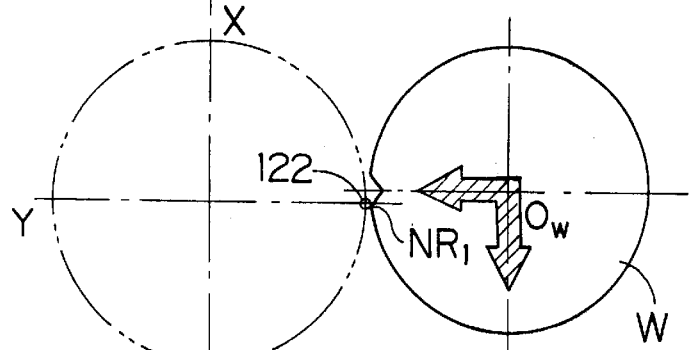
F I G. 1 2 (b)
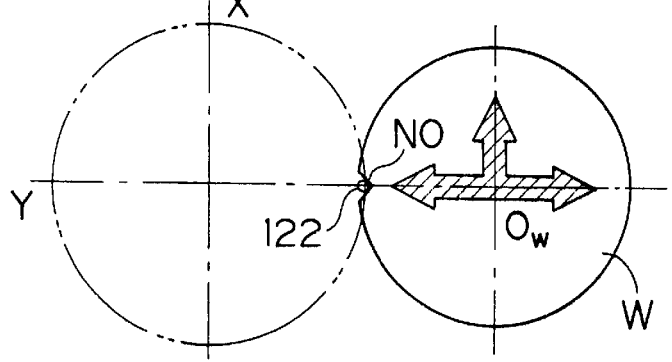
F I G. 1 2 (c)
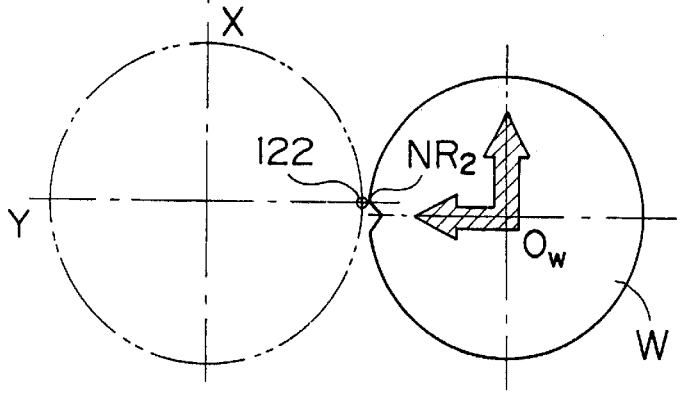
F I G. 1 2 (d)

F I G. 1 3 (a)
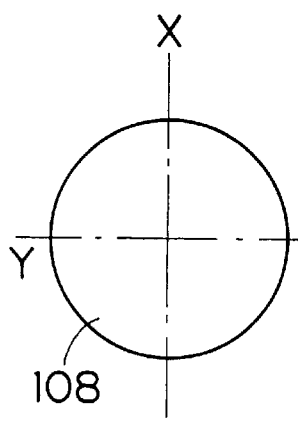
F I G. 1 3 (d)
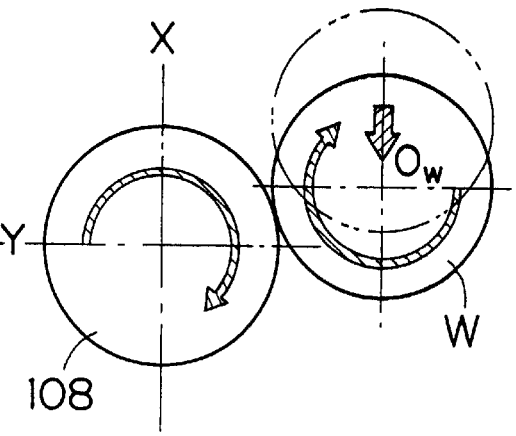
F I G. 1 3 (b)
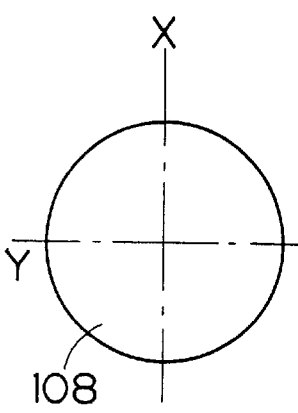
F I G. 1 3 (e)
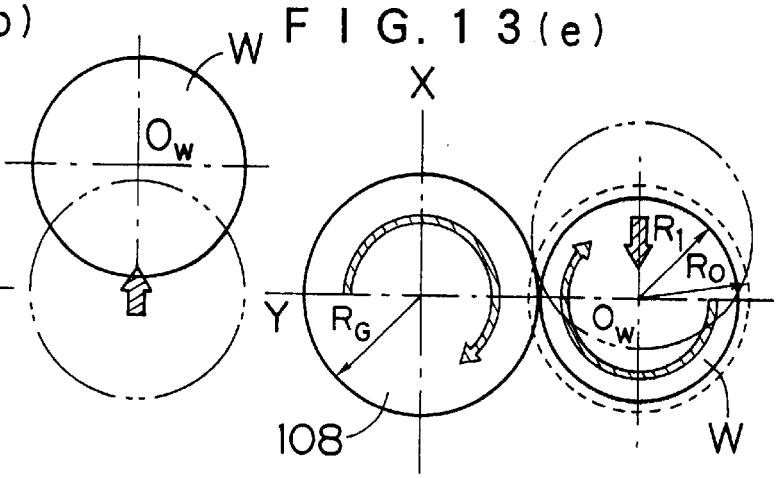
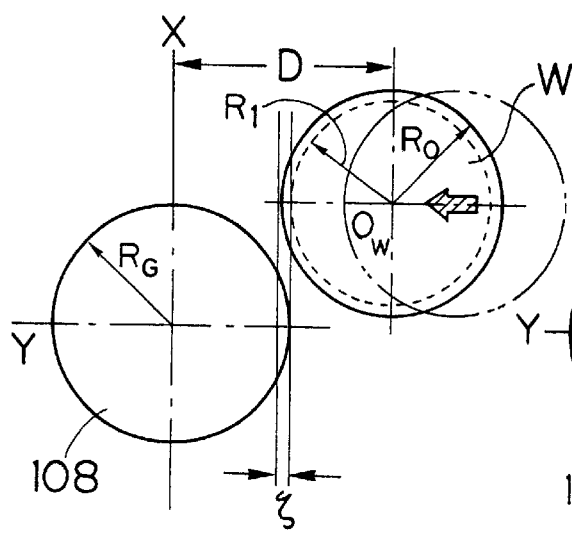
F I G. 1 3 (c)
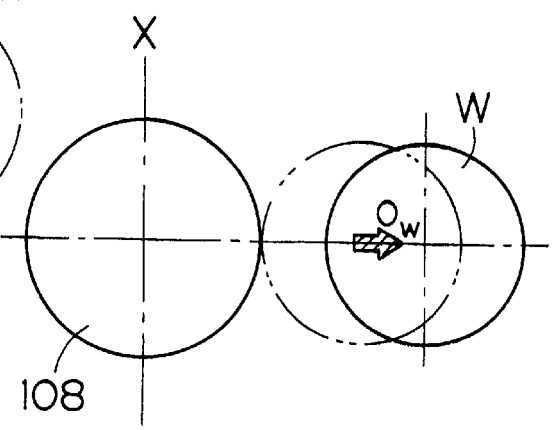
F I G. 1 3 (f)

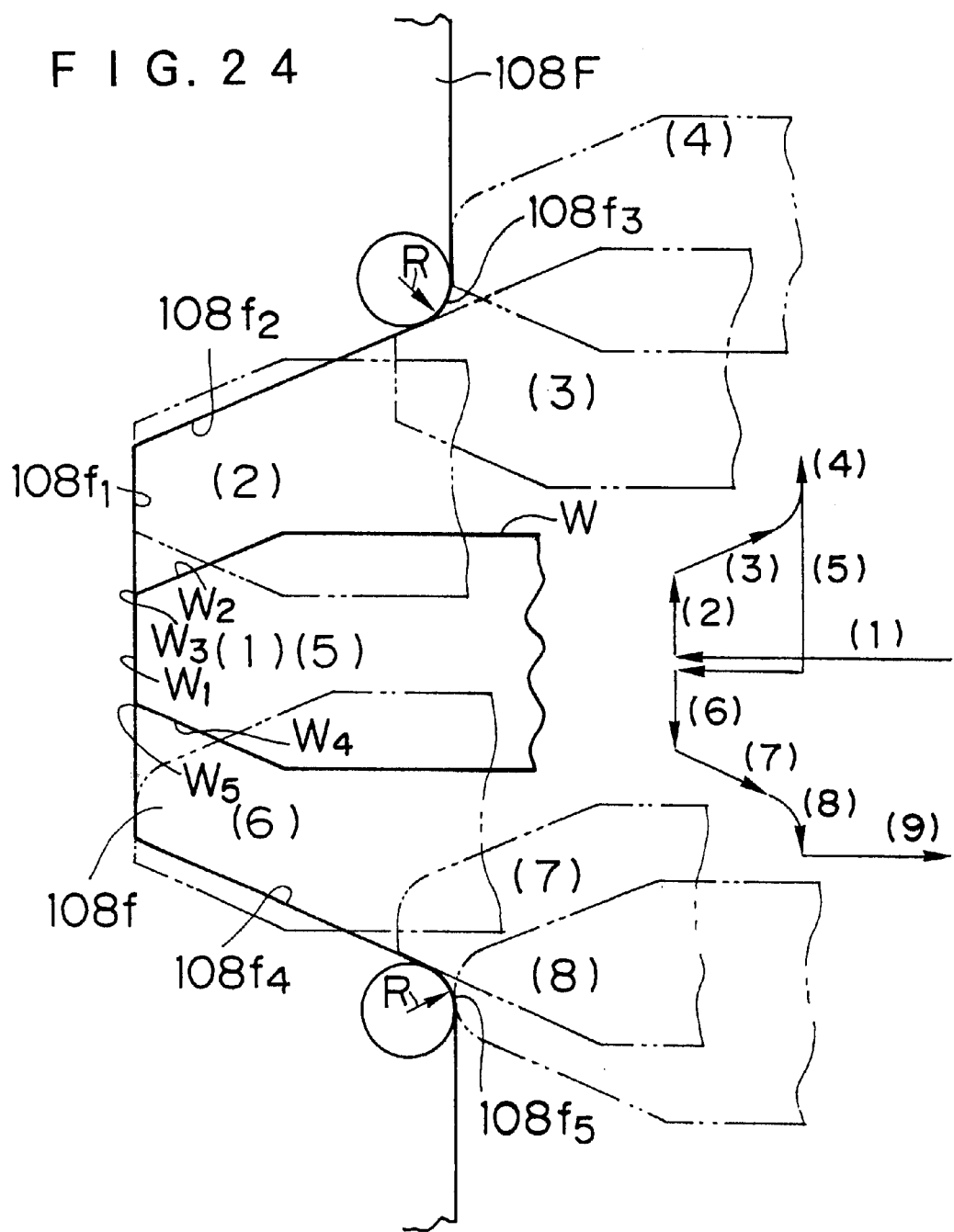

APPARATUS AND METHOD FOR CHAMFERING WAFER

BACKGROUND OF THE INVENTION

1. Field of the Invention

The present invention relates generally to an apparatus and method for chamfering a wafer, and more particularly to an apparatus and method for chamfering a periphery of a wafer.

2. Description of Related Art

A silicon ingot is sliced by a slicing machine into wafers, which are used for semiconductor devices. Then, the periphery of each wafer is chamfered in order to prevent the wafer from chipping, cracking, and so on. The wafer is chamfered by pressing a rotating grindstone against the periphery of the rotating wafer. A conventional chamfering apparatus moves the grindstone forward and backward, or vertically and horizontally with respect to the wafer to chamfer the periphery of the wafer.

The conventional chamfering apparatus, however, does not have sufficient stiffness because the grindstone rotates at a high speed during the chamfering, and it vibrates easily. Therefore, the machined surface of the wafer has coin marks, chipping, or the like.

The conventional chamfering apparatus relatively moves the wafer closer to the grindstone, which is rotating at the high speed (at a circumferential speed of 1000–3000 [m/min]). After grinding the wafer by a predetermined amount, the chamfering apparatus rotates the wafer slowly (at a circumferential speed of 0.6–3 [m/min]) to chamfer the whole circumference of the wafer. To reduce the machining time for one wafer, it is necessary to increase the circumferential speed of the wafer. To increase the circumferential speed of the wafer, the rotational speed of the grindstone must be increased, or the grindstone must have a relatively rough mesh. In the case that the rotational speed of the grindstone is increased, if a newly-attached grindstone is not well-balanced, the grindstone vibrates while rotating at a high speed. This causes defects on the machined surface of the wafer (coin marks, chipping, cracks, or the like). On the other hand, in the case that the grindstone has the relatively rough mesh, the grindstone grinds the wafer by a large amount, and thus, the wafer can be badly damaged. To address these problems, the diameter of the wafer is reduced by etching, or the diameter is reduced by gradually chamfering the wafer. These methods, however, require a long time.

SUMMARY OF THE INVENTION

In view of the foregoing, it is an object of the present invention to provide an apparatus and method for accurately chamfering the wafer.

To achieve the above-mentioned object, the present invention is directed to a wafer chamfering apparatus for chamfering a periphery of a wafer, comprising: a main grindstone; a main grindstone rotating means for rotating the main grindstone; a wafer table for holding the wafer in parallel with the main grindstone; a wafer table rotating means for rotating the wafer table; and a wafer table moving means for moving the wafer table along an axis of the wafer and moving the wafer table along a face of the wafer; wherein the wafer is rotated while being moved to the main grindstone being rotated, and the periphery of the wafer is brought into contact with the main grindstone so as to be chamfered.

According to the present invention, the main grindstone is rotated at the constant position, and the wafer is moved so that the periphery thereof can come into contact with the main grindstone. The stiffness of the apparatus is improved since the main grindstone is only rotated and not moved. This prevents the vibrations of the main grindstone, which is rotating at a high speed, and improves the accuracy of the machined surface of the wafer.

To achieve the above-mentioned object, the present invention is also directed to a wafer chamfering method, comprising the steps of: rotating a grindstone and a wafer at high speeds; and getting the grindstone and the wafer closer to each other, thereby gradually chamfering a periphery of the wafer by the grindstone.

According to the present invention, both the grindstone and the wafer are rotated at high speeds to thereby increase the machining speed and reduce the machining time. Grinding the periphery of the wafer gradually prevents the damage on the machined surface of the wafer, thus improving the accuracy of the machined surface of the wafer.

To achieve the above-mentioned object, the present invention is also directed to a wafer chamfering method, comprising the steps of: arranging a grindstone and a wafer separately on two parallel straight lines with a predetermined interval; rotating the grindstone and the wafer at high speeds; moving at least one of the wafer and the grindstone on the straight line to bring the grindstone into contact with a periphery of the wafer, thereby gradually chamfering the periphery of the wafer by the grindstone.

According to the present invention, both the grindstone and the wafer are rotated at high speeds to thereby increase the machining speed and reduce the machining time. Grinding the periphery of the wafer gradually prevents the damage on the machined surface of the wafer, thus improving the accuracy of the machined surface of the wafer.

To achieve the above-mentioned object, the present invention is directed to a wafer chamfering method, comprising the steps of: roughly chamfering a periphery of a rotating wafer by a first rotating grindstone with a large diameter by getting the rotating wafer and the first rotating grindstone closer to each other; and finely chamfering the periphery of the rotating wafer by a second rotating grindstone with a small diameter by getting the rotating wafer and the second rotating grindstone closer to each other.

According to the present invention, it is possible to prevent the vibrations of the grindstone during the finely chamfering by using the grindstone with the small diameter. Thus, it is possible to improve the accuracy of the machined surface of the wafer.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIGS. 7(a) and 7(b) are explanation drawings showing a wafer chamfering method;

FIGS. 8(a)–8(f) are explanation drawings showing a method of chamfering a wafer with an orientation flat;

FIGS. 9(a)–9(e) are explanation drawings showing a method of chamfering a wafer with a notch;

FIGS. 11(a)–11(d) are explanation drawings showing a method of chamfering a circular part of the wafer with the notch;

FIGS. 12(a)–12(d) are explanation drawings showing a method of chamfering the notch and the notch corners of the wafer with the notch;

FIGS. 13(a)–13(f) are explanation drawings showing a wafer chamfering method according to the second embodiment;

FIG. 24 is an explanation drawing showing the wafer chamfering method according to the eighth embodiment.

DETAILED DESCRIPTION OF THE PREFERRED EMBODIMENT

This invention will be described in further detail by way of example with reference to the accompanying drawings.

Figure 1:
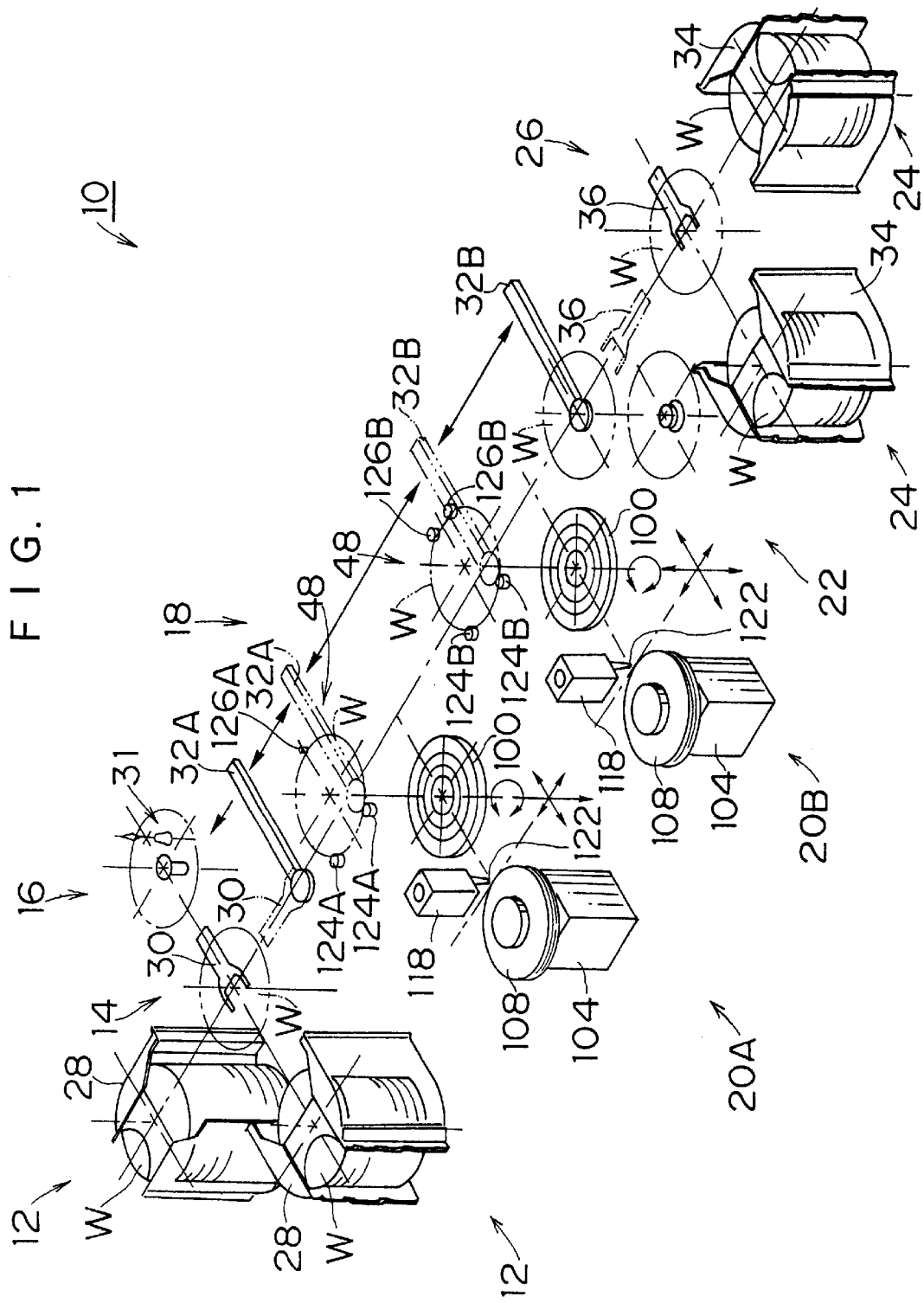
FIG. 1 is a perspective view showing the entire structure of a wafer chamfering apparatus according to an embodiment of the present invention.

FIG. 1 is a perspective view showing the entire structure of a wafer chamfering apparatus according to an embodiment of the present invention. As shown in FIG. 1, the wafer chamfering apparatus 10 comprises feeding cassette parts 12, a feeding transfer part 14, a presetting part 16, a transfer part 18, a first machining part 20A, a second machining part 20B, a cleaning part 22, collecting cassette parts 24 and a collecting transfer part 26.

The feeding cassette parts 12 are disposed at two positions, and feeding cassettes 28, which store wafers W to be chamfered, are set in the feeding cassette parts 12.

The feeding transfer part 14 has a transfer arm 30, which is capable of moving vertically and horizontally and rotating. The transfer arm 30 transfers the wafer W from the feeding cassettes 28 to the presetting part 16. The transfer arm 30 also transfers the wafer W to the transfer part 18 after the presetting.

The presetting part 16 has a thickness measuring part 31, which measures the thickness of the wafer W. At the same time, the presetting part 16 detects an orientation flat or a notch formed on the wafer W, and aligns the orientation flat or the notch in a predetermined direction. In short, the presetting part 16 performs the pre-alignment.

The transfer part 18 has a first transfer arm 32A and a second transfer arm 32B, which are capable of moving vertically and horizontally. The first transfer arm 32A receives the wafer W from the transfer arm 30 and transfers the wafer W to the first machining part 20A or the second machining part 20B. After the first machining part 20A or the second machining part 20B finishes chamfering the wafer W, the second transfer arm 32B transfers the wafer W to the cleaning part 22.

The first machining part 20A and the second machining part 20B chamfer the wafer W by pressing the periphery of the wafer W against rotating grindstones. The structure of the first machining part 20A and the second machining part 20B will be described later in further detail.

The cleaning part 22 is a spin cleaner, which cleans the chamfered wafer W by rotating the wafer W while supplying cleaning liquid to the wafer W. After the cleaning, the cleaning part 22 rotates the wafer W at a high speed to dry the wafer W by centrifugal force.

The collecting cassette parts 24 are disposed at two positions, and the chamfered wafers W are stored in collecting cassettes 34, which are set in the collecting cassette parts 24.

The collecting transfer part 26 has a transfer arm 36, which is capable of moving vertically and horizontally and rotating. The transfer arm 36 transfers the cleaned wafer W to the collecting cassettes 34, and stores the wafer W in the collecting cassettes 34.

Figure 2:
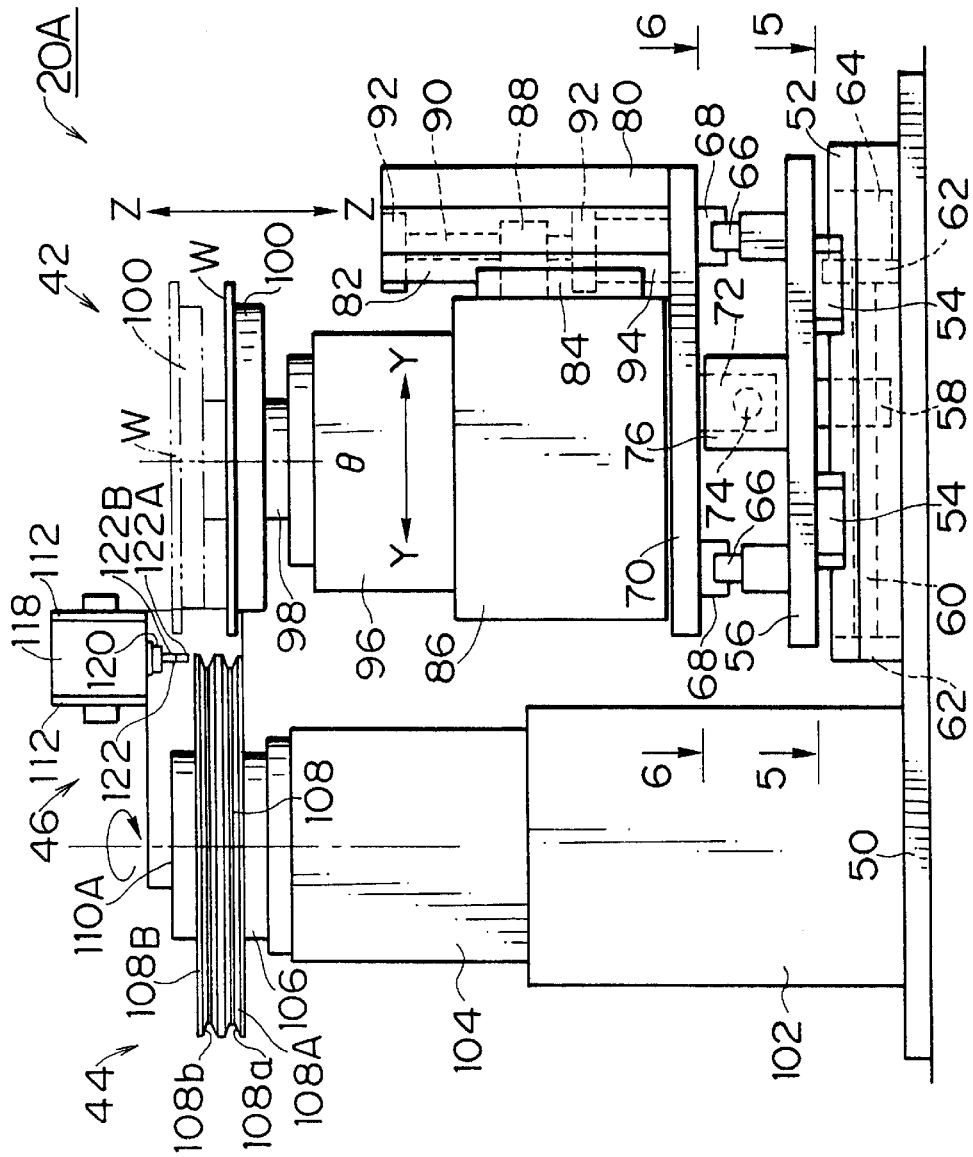
FIG. 2 is a side view showing the structure of a first machining part 20A in FIG. 1.
Figure 3:
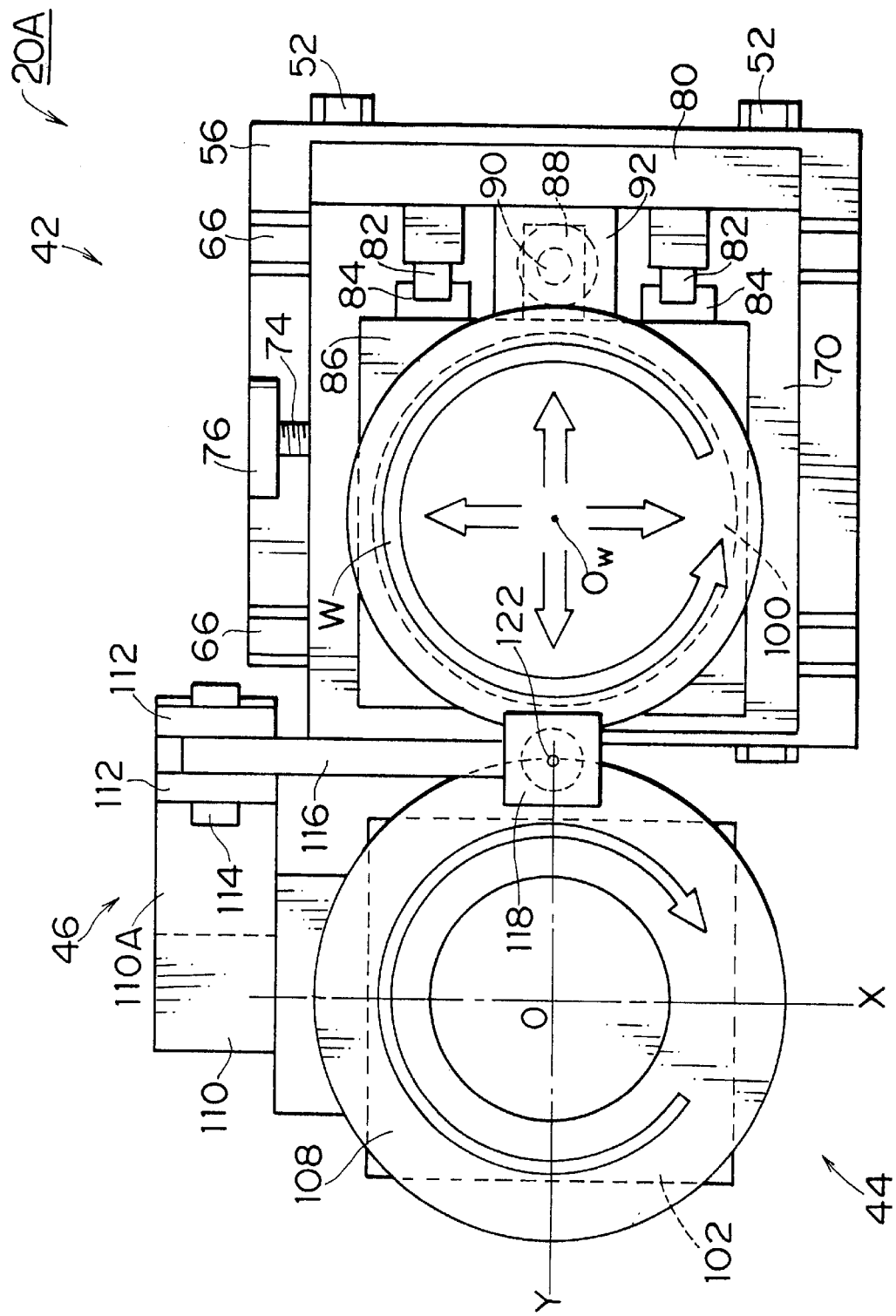
FIG. 3 is a plan view showing the structure of the first machining part 20A.

FIGS. 2 and 3 are a side view and a plan view showing the structure of the first machining part 20A. As shown in FIGS. 2 and 3, the first machining part 20A comprises a wafer feeding unit 42, a periphery machining unit 44, a notch machining unit 46, and a wafer centering unit 48 in FIG. 1.

Figure 5:
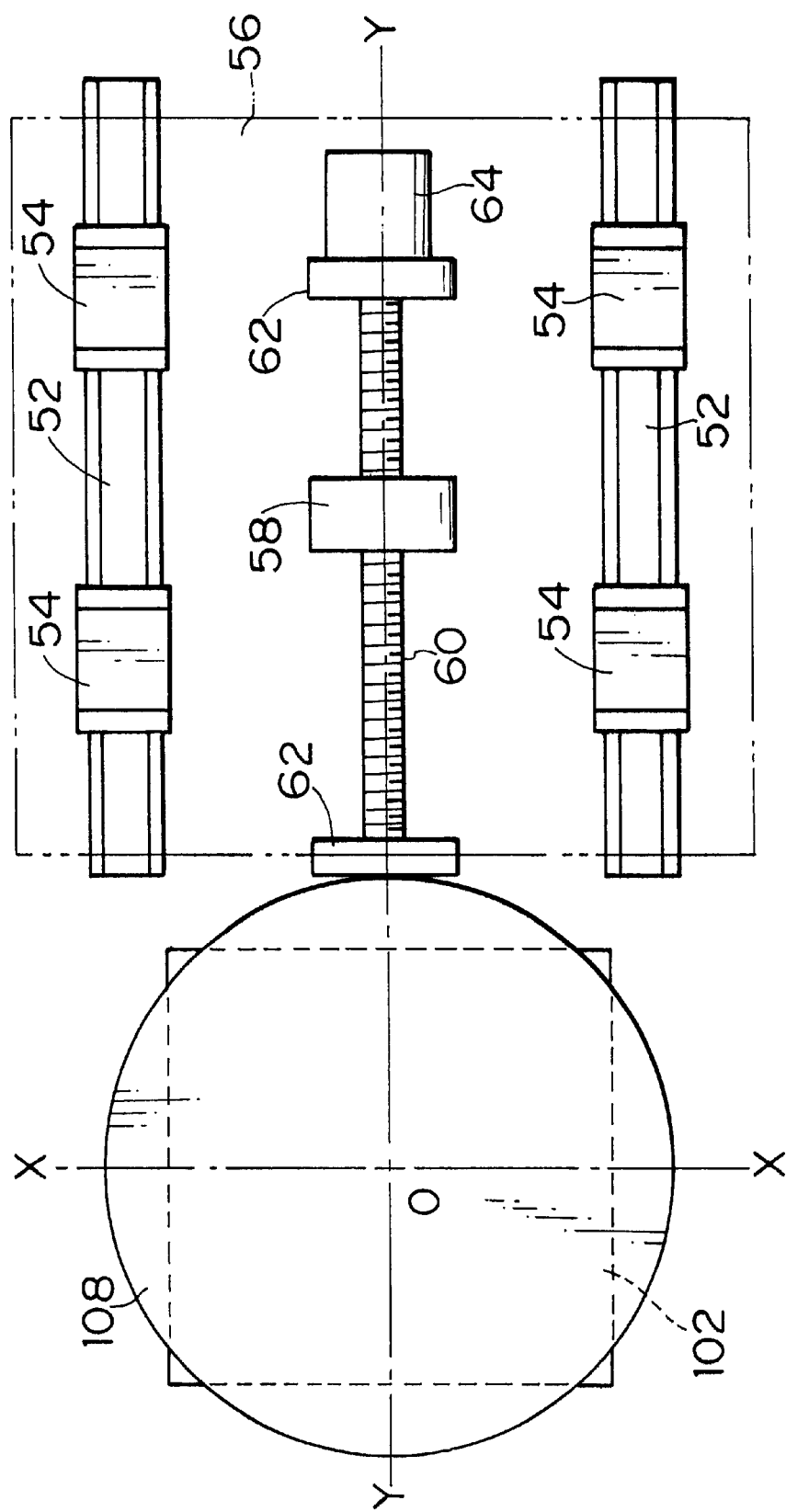
FIG. 5 is a sectional view taken along a line 5—5 of FIG. 2.

A description will be given of the structure of the wafer feeding unit 42. As shown in FIGS. 2, 3 and 5, a pair of Y-axis guide rails 52 is arranged at a predetermined interval on a horizontal base plate 50. A Y-axis table 56 is slidably supported on the pair of Y-axis guide rails 52 through Y-axis linear guides 54.

A nut member 58 is secured to the bottom of the Y-axis table 56, and the nut member 58 connects to a Y-axis ball screw 60, which is arranged between the Y-axis guide rails 52. Both ends of the Y-axis ball screw 60 are rotatably supported by bearing members 62 placed on the base plate 50. One end of the Y-axis ball screw 60 connects to an output shaft of a Y-axis motor 64 attached to one of the bearing members 62. Running the Y-axis motor 64 rotates the Y-axis ball screw 60, and the rotation of the Y-axis ball screw 60 slides the Y-axis table 56 horizontally along the Y-axis guide rails 52. The Y-axis table 56 slides along the Y-axis.

Figure 6:
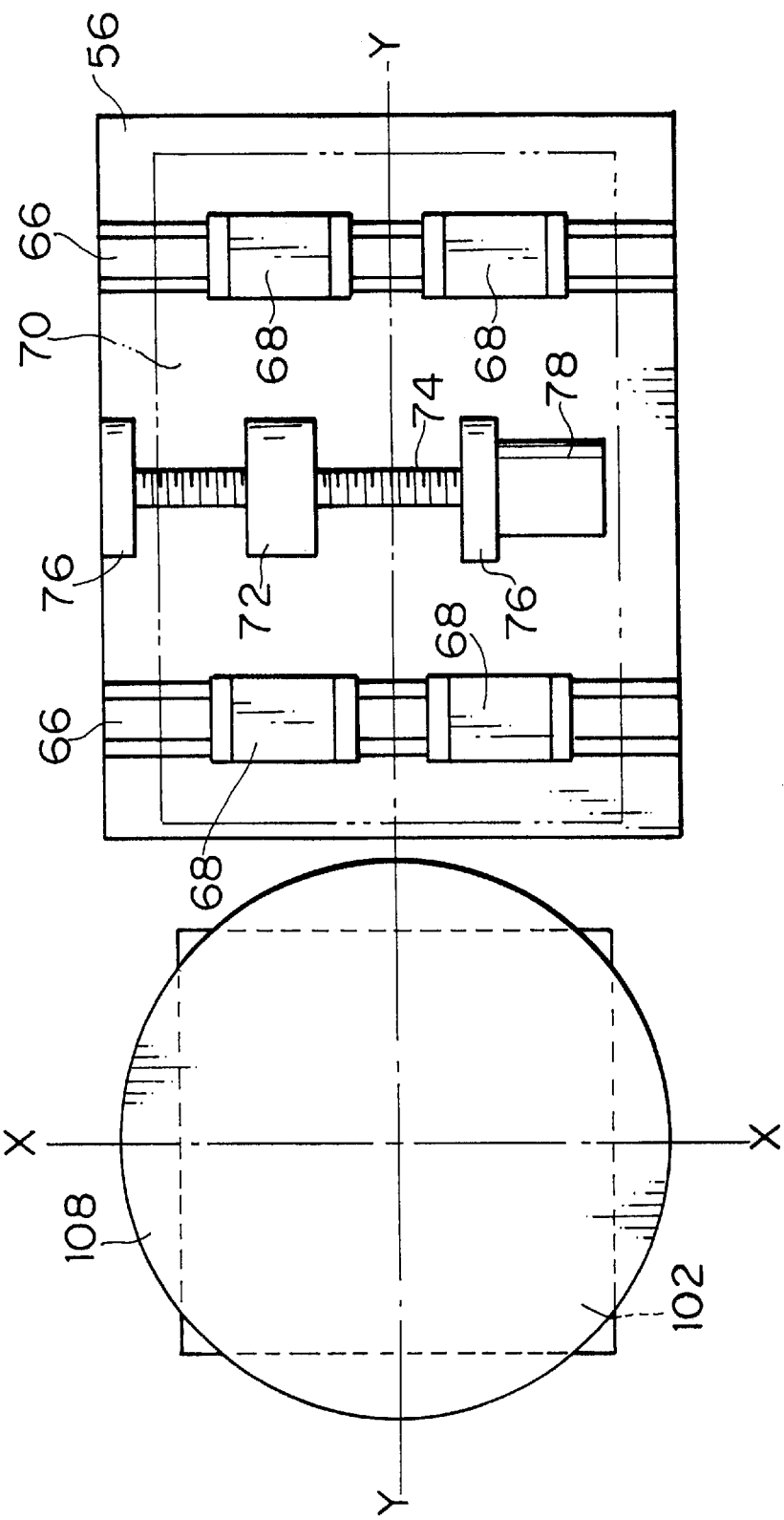
FIG. 6 is a sectional view taken along a line 6—6 of FIG. 2.

As shown in FIGS. 2, 3 and 6, a pair of X-axis guide rails 66 is arranged perpendicularly to the pair of Y-axis guide rails 52 on the Y-axis table 56. An X-axis table 70 is slidably supported on the pair of X-guide rails 66 through X-axis linear guides 68.

A nut member 72 is secured to the bottom of the X-axis table 70, and the nut member 72 connects to an X-axis ball screw 74, which is arranged between the X-axis guide rails 66. Both ends of the X-axis ball screw 74 are rotatably supported by a pair of bearing members 76 placed on the X-axis table 70. One end of the X-axis ball screw 74 connects to an output shaft of an X-axis motor 78 attached to one of the bearing members 76. Running the X-axis motor 78 rotates the X-axis ball screw 74, and the rotation of the X-axis ball screw 74 slides the X-axis table 70 horizontally along the X-axis guide rails 66. The X-axis table 70 slides along the X-axis.

As shown in FIGS. 2 and 3, a Z-axis base 80 stands vertically on the X-axis table 70. A pair of Z-axis guide rails 82 is arranged at a predetermined interval on the X-axis base 80. A Z-axis table 86 is slidably supported by the pair of Z-axis guide rails 82 through Z-axis linear guides 84.

A nut member 88 is secured to the side of the Z-axis table 86, and the nut member 88 connects to a Z-axis ball screw 90, which is arranged between the Z-axis guide rails 82. Both ends of the Z-axis ball screw 90 are rotatably supported by a pair of bearing members 92 placed on the Z-axis base 80. The bottom end of the Z-axis ball screw 90 connects to an output shaft of a Z-axis motor 94 attached to the lower bearing member 92. Running the Z-axis motor 94 rotates the Z-axis ball screw 90, and the rotation of the Z-axis ball screw 90 slides the Z-axis table 86 vertically along the Z-axis guide rails 82. The Z-axis table 86 slides along the Z-axis.

A θ-axis motor 96 is vertically placed on the Z-axis table 86. A θ-axis shaft 98 connects to an output shaft of the θ-axis motor 96, and a wafer table 100 is horizontally secured to the top end of the θ-axis shaft 98. The wafer W to be chamfered is positioned and held by suction on the wafer table 100. Running the θ-axis motor 96 rotates the wafer W about the θ-axis.

In the wafer feeding unit 42, running the Y-axis motor 64 slides the wafer table 100, which holds the wafer W, horizontally along the Y-axis; and running the X-axis motor 78 slides the wafer table 100 horizontally along the X-axis. Running the Z-axis motor 94 slides the wafer table 100 vertically along the Z-axis, and running the θ-axis motor 96 rotates the wafer table 100 about the θ-axis.

Figure 4:
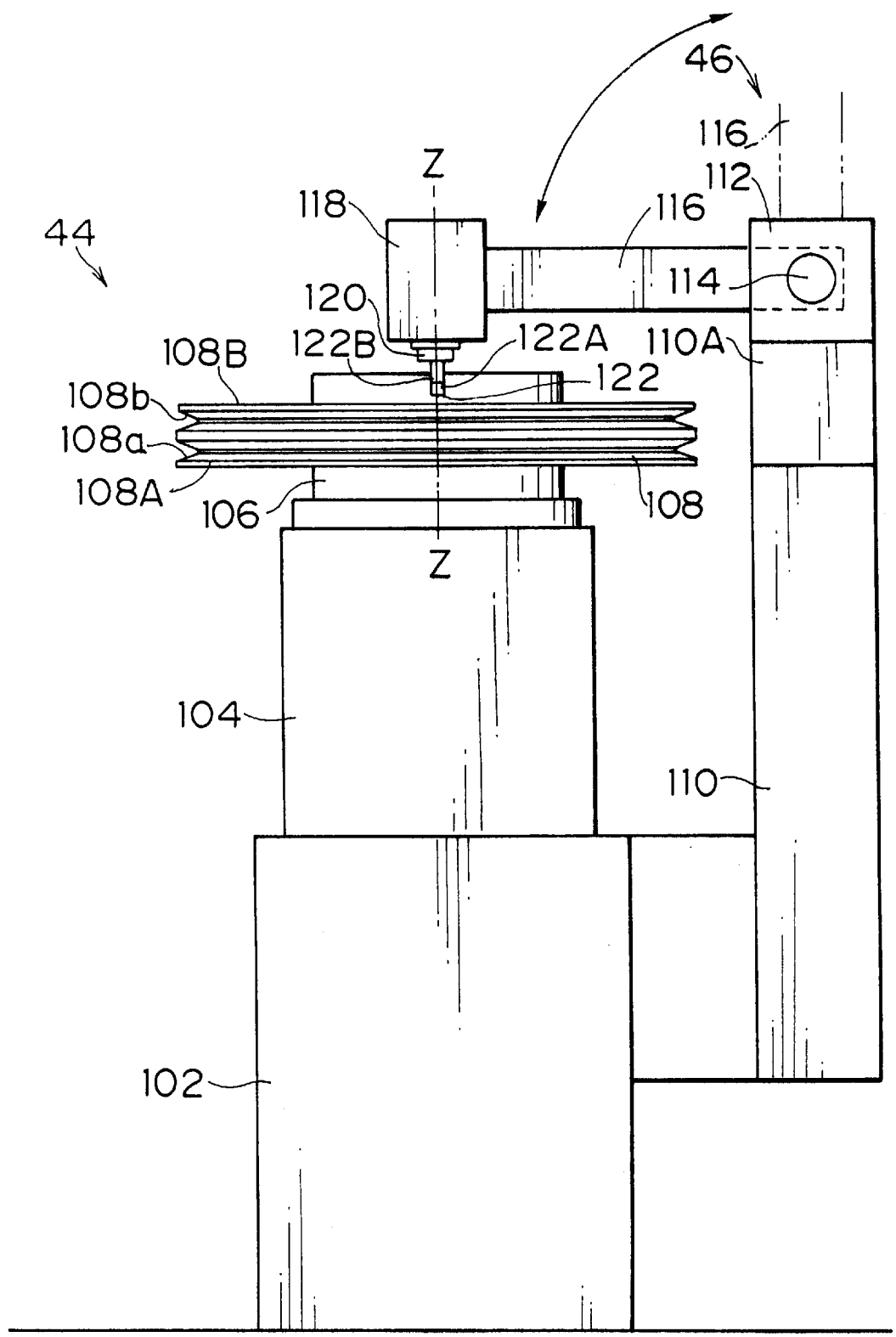
FIG. 4 is a front view showing the structure of a periphery machining unit and a notch machining unit.

A description will be given of the structure of the periphery machining unit 44. As shown in FIGS. 2–4, a base 102 is vertically placed on the base plate 50. A periphery motor 104 is vertically placed on the base 102, and a periphery spindle 106 connects to an output shaft of the periphery motor 104. A periphery machining grindstone 108 for chamfering the periphery of the wafer W is mounted on the periphery spindle 106. Running the periphery motor 104 rotates the periphery machining grindstone 108.

The periphery machining grindstone 108 is composed of a periphery rough-machining grindstone 108A and a periphery fine-machining grindstone 108B, which are connected coaxially, to thereby successively perform the rough-machining and the fine-machining. The grindstones 108A & 108B are the so-called "formed grindstones", and grooves 108a & 108b are formed at the peripheries of the grindstones 108A & 108B, respectively. The grooves 108a & 108b are formed in a desired chamfered shape of the wafer W. Thus, the periphery of the wafer W is only pressed against the grooves 108a & 108b in order to be chamfered.

A straight line that goes through a rotational center O of the periphery machining grindstone 108 and is parallel with the Y-axis guide rails 52, is defined as "the Y-axis"; and a straight line that goes through the rotational center O of the periphery machining grindstone 108 and is parallel with the X-axis guide rails 66, is defined as "the X-axis". The rotational axis of the periphery machining grindstone 108 is defined as "the Z-axis".

A description will be given of the structure of the notch machining unit 46. As shown in FIGS. 2–4, a support 110 is vertically disposed at the side of the base 102 along the rotational shaft of the periphery machining grindstone 108. The bottom end of the support 110 is supported at the side of the base 102. A horizontal beam 110A is integrally formed at the top end of the support 110. A pair of bearing members 112 is arranged at the end of the beam 110A. An arm 116 is swingably supported by the pair of bearing members 112 through a pin 114.

A notch motor 118 is supported at the end of the swingable arm 116, and a notch spindle 120 connects to an output shaft of the notch motor 118. A notch machining grindstone 122 for chamfering the notch formed on the wafer W is attached to the notch spindle 120. Running the notch motor 118 rotates the notch machining grindstone 122.

A lock means (not shown) locks the arm 116. When the arm 116 is relieved of the lock, the arm 116 becomes swingable. In the locked state, the arm 116 is held horizontally as shown in FIGS. 3 & 4, and the notch machining grindstone 122 is positioned on the Y-axis as shown in FIG. 3.

Although not shown in detail, the notch machining grindstone 122 is composed of a notch rough-machining grindstone 122A and a notch fine-machining grindstone 122B, which are connected coaxially. Grooves with a desired chamfering shape of the wafer W are formed at the peripheries of the grindstones 122A & 122B (not shown).

A description will now be given of the structure of the wafer centering unit 48. As shown in FIG. 1, the wafer centering unit 48 is disposed above the wafer table 100, and a lifting mechanism (not shown) moves the wafer centering unit 48 vertically. There are two types of the wafer centering unit 48 for a wafer W with a notch and a wafer W with an orientation flat. They are exchanged according to the type of the wafer W.

The centering unit 48 for the wafer W with the notch (the centering unit 48 mounted at the first machining part 20A in FIG. 1) has two pinch rollers 124A and a positioning piece 126A. A moving means (not shown) moves the pinch rollers 124A and the positioning piece 126A so that they can move closer to or farther from each other The pinch rollers 124A and the positioning piece 126A pinch the wafer W in order to center the wafer W. The positioning piece 126A is fitted in the notch formed in the wafer W so as to position the notch at a predetermined position.

On the other hand, the centering unit 48 for the wafer with the orientation flat (the centering unit 48 mounted at the second machining part 20B in FIG. 1) has two pinch rollers 124B and two positioning pieces 126B. A moving means (not shown) moves the two pinch rollers 124B and the two positioning pieces 126B so that they can move closer to or farther from each other. The pinch rollers 124B and the positioning pieces 126B pinch the wafer W in order to center the wafer W. The positioning pieces 126B come into contact with the orientation flat of the wafer W so as to position the orientation flat at a predetermined position.

When the wafer centering unit 48 receives the wafer W from the first transfer arm 32A, the position of the notch or the orientation flat corresponds to the position of the positioning piece(s) 126A or 126B since the wafer W has already been pre-aligned at the presetting part 16. Thus, by pinching the wafer W transferred by the first transfer arm 32A as it is, the positioning piece 126A gets into the notch of the wafer W, or the positioning pieces 126B come into contact with the orientation flat of the wafer W so that the wafer W can be positioned automatically.

In FIG. 1, the centering unit 48 for the wafer W with the notch is mounted at the first machining part 20A, and the centering unit 48 for the wafer W with the orientation flat is mounted at the second machining part 20B for the sake of convenience. Actually, however, the centering units 48 of the same type may be mounted at both the first machining part 20A and the second machining part 20B according to the type of the wafer W.

The second machining part 20B is constructed in the same manner as the first machining part 20A, and thus, it will not be explained.

A description will now be given of the operation of the embodiment of the wafer chamfering apparatus 10 according to the present invention.

A description will be given of the flow of the processing for the wafer W. An operator sets the feeding cassettes 28, which store a number of wafers W to be chamfered, at the feeding cassette parts 12. Then, the operator sets the collecting cassettes 34 for collecting the chamfered wafers W at the collecting cassette parts 24. After setting the cassettes 28 & 34, the operator starts operating the apparatus.

The transfer arm 30 picks up the first wafer W from the feeding cassette 28 set at one of the feeding cassette parts 12. The transfer arm 30 transfers the wafer W to the presetting part 16. The presetting part 16 measures the thickness of the transferred wafer W and performs the pre-alignment for the wafer W.

After the pre-alignment, the transfer arm 30 transfers the wafer W from the presetting part 16 to a predetermined delivering position. The wafer W is delivered to the first transfer arm 32A of the transfer part 18, which is located at the delivering position. The first transfer arm 32A transfers the wafer W to the first machining part 20A or the second machining part 20B. The first transfer arm 32A selects one machining part that is not machining any wafer, and transfers the wafer W to the selected machining part. Then, the first machining part 20A or the second machining part 20B chamfers the periphery of the transferred wafer W.

After the chamfering, the second transfer arm 32B transfers the wafer W to the cleaning part 22. The cleaning part 22 eliminates the sludge, which is adhered to the wafer W during the machining.

After the cleaning, the transfer arm 36 of the collecting transfer part 26 picks up the wafer W from the cleaning part 22 and stores the wafer W in one of the collecting cassettes 34 of the collecting cassette parts 24.

The wafers W are stored in the collecting cassettes 34 one by one, and when all the wafers W are stored in the collecting cassettes 34, a sequence of chamfering steps is completed.

A description will now be given of the method for chamfering the wafer W at the first machining part 20A (or the second machining part 20B).

The first machining part 20A can machine both the wafer W with the orientation flat and the wafer W with the notch.

A description will be given of the method for chamfering the wafer W with the orientation flat.

After the first transfer arm 32A of the transfer part 18 transfers the wafer W to the first machining part 20A, the wafer W is first delivered to the wafer centering unit 48 (for the wafer W with the orientation flat). The wafer centering unit 48 pinches the wafer W with the two pinch rollers 124B and the two positioning pieces 126B to receive the wafer W from the first transfer arm 32A. Then, the wafer centering unit 48 centers and positions the received wafer W.

The wafer centering unit 48 moves down by a predetermined amount, and places the wafer W on the wafer table 100, which is located at a predetermined wafer receiving position. Then, the wafer centering unit 48 releases the wafer W, and moves up by a predetermined amount to the position where it received the wafer W from the transfer arm 32.

The wafer table 100 holds the wafer W thereon by suction. Then, the wafer table 100 moves down by a predetermined amount.

As shown in FIG. 7(a), the wafer W is held on the wafer table 100 in such a way that the center $O_W$ of the wafer W is on the rotational axis θ of the wafer table 100 and the orientation flat OF of the wafer W is parallel with the X-axis. As shown in FIG. 7(b), the wafer table 100 moves down by the predetermined amount from the wafer receiving position so that the wafer W can be positioned at the same height as the groove 108a of the periphery rough-machining grindstone 108A. The position of the wafer W at this time will hereafter be referred to as the "rough-chamfering reference position."

When the wafer W held on the wafer table 100 reaches the rough-chamfering reference position, the chamfering is started. At first, the rough-chamfering is performed.

FIGS. 8(a)–8(f) show the procedure for chamfering the wafer W with the orientation flat. A description will hereunder be given of the method for chamfering the wafer W with the orientation flat with reference to FIGS. 8(a)–8(f).

The periphery motor 104 is run to rotate the periphery machining grindstone 108. At the same time, the Y-axis motor 64 is run to move the wafer W toward the periphery rough-machining grindstone 108A. The Y-axis motor 64 is stopped when the wafer W moves by a predetermined distance and a circular part C of the wafer W comes into contact with the groove 108a of the periphery rough-machining grindstone 108A. Then, the θ-axis motor 96 is run to start rotating the wafer W about the θ-axis. Thus, the circular part C of the wafer W is roughly chamfered as shown in FIG. 8(a).

Due to the rotation of the wafer W, a first orientation flat corner $OR_1$ of the wafer W comes into contact with the periphery rough-machining grindstone 108A as shown in FIG. 8(b). At this time, the θ-axis motor 96, the X-axis motor 78 and the Y-axis motor 64 are run at the same time to rotate the wafer W about the θ-axis and move the wafer W along the X-axis and the Y-axis as shown in FIG. 8(c). Accordingly, the wafer W moves in such a manner that the first orientation flat corner $OR_1$ is always in contact with the periphery rough-machining grindstone 108A. Thus, the periphery rough-machining grindstone 108A roughly chamfers the first orientation flat corner $OR_1$.

After the chamfering of the first orientation flat corner $OR_1$, the orientation flat OF of the wafer W becomes parallel with the X-axis as indicated by a solid line in FIG. 8(c). Then, the X-axis motor 78 is run to feed the wafer W along the X-axis as shown in FIG. 8(d). Thus, the orientation flat OF of the wafer W is roughly chamfered.

When the chamfering of the orientation flat OF is completed, a second orientation flat corner $OR_2$ of the wafer W comes into contact with the periphery rough-machining grindstone 108A as shown in FIG. 8(e). At this time, the θ-axis motor 96, the X-axis motor 78 and the Y-axis motor 64 are run at the same time to rotate the wafer W about the θ-axis and move the wafer W along the X-axis and the Y-axis. The wafer W moves in such a manner that the second orientation flat corner $OR_2$ is always in contact with the periphery rough-machining grindstone 108A. Thus, the periphery rough-machining grindstone 108A roughly chamfers the second orientation flat corner $OR_2$.

After the chamfering of the second orientation flat corner $OR_2$, the axis of the wafer W is positioned on the Y-axis as indicated by a broken line in FIG. 8(f). Then, the θ-axis motor 96 is run to rotate the wafer W about the θ-axis. Thus, the circular part C of the wafer W is chamfered.

The rotation of the wafer W about the θ-axis returns the wafer W to the chamfering start position (the position where the wafer W comes into contact with the periphery rough-machining grindstone 108A for the first time) after one rotation. The above-described sequence of chamfering steps is repeated to roughly chamfer the whole circumference of the wafer W.

When the rough-chamfering is completed after repeating the sequence a plurality of times, the wafer W stops rotating at the chamfering start position. Thereafter, the wafer W moves by the predetermined amount away from the periphery rough-machining grindstone 108A to return to the rough-chamfering reference position.

When the wafer W returns to the rough-chamfering reference position, the Z-axis motor 94 is run to move up the wafer table 100 by a predetermined amount, so that the wafer W held on the wafer table 100 is positioned at the same height as the groove 108b of the periphery fine-machining grindstone 108B. The position of the wafer W at this time will hereafter be referred to as the "finish-chamfering reference position."

Then, the Y-axis motor 64 is run to move the wafer W along the Y-axis toward the periphery fine-machining grindstone 108B. The Y-axis motor 64 is stopped when the wafer W moves by a predetermined distance and the circular part C of the wafer W comes into contact with the groove 108b of the periphery fine-machining grindstone 108B. Then, the θ-axis motor 96 is run to start rotating the wafer W about the θ-axis.

Thereafter, the circular part C, the orientation flat corners OR and the orientation flat OF of the wafer W are finely chamfered by controlling the rotation of the wafer W about the θ-axis and the movement of the wafer W along the X-axis and the Y-axis in the same manner as in the rough-chamfering.

After the finish-chamfering, the wafer W stops rotating at the finish chamfering start position (the position where the wafer W comes into contact with the periphery fine-machining grindstone 108B for the first time). Then, the wafer W moves by the predetermined amount away from the periphery fine machining grindstone 108B to return to the finish-chamfering reference position, and the periphery motor 104 is stopped to stop the rotation of the periphery machining grindstone 108.

When the wafer W returns to the finish-chamfering reference position, the wafer table 100 moves up by a predetermined amount along the Z-axis until it reaches the wafer receiving position. Then, the second transfer arm 32B of the transfer part 18 above the wafer table 100 moves down by a predetermined amount. After the wafer table 100 relieves the wafer W of the suction, the transfer arm 32B picks up the wafer W from the wafer table 100 and transfers the wafer W to the cleaning part 22.

Thus, the rough-chamfering and the finish-chamfering for one wafer W are completed.

A description will now be given of the method for chamfering the wafer W with the notch. The steps before the start of chamfering, in other words, the steps before the wafer W is positioned and held on the wafer table 100 by suction and is positioned at the predetermined rough-chamfering reference position are same as the steps in the case of the wafer W with the orientation flat. Thus, a description will be given of the steps from the start of chamfering.

FIGS. 9(a)–9(e) show the procedure for chamfering the wafer W with the notch. The circular part C of the wafer W is roughly chamfered at first. When the wafer W reaches the predetermined rough-chamfering reference position, the periphery motor 104 is run to rotate the periphery machining grindstone 108. At the same time, the Y-axis motor 64 is run to move the wafer W along the Y-axis toward the periphery rough-machining grindstone 108A. The Y-axis motor 64 is stopped when the wafer W moves by the predetermined distance and the circular part C of the wafer W comes into contact with the groove 108a of the periphery rough-machining grindstone 108A. Then, the θ-axis motor 96 is run to rotate the wafer W about the θ-axis. Thus, the circular part C of the wafer W is roughly chamfered as shown in FIGS. 9(a) and 9(b).

The wafer W is rotated about the θ-axis a predetermined number of times. After the rotations, the θ-axis motor 96 is stopped, and the rough-chamfering for the circular part C of the wafer W is completed. The wafer W stops at the chamfering start position (the position where the wafer W comes into contact with the periphery rough-machining grindstone 108A for the first time). Then, the wafer W moves by the predetermined amount away from the periphery rough-machining grindstone 108A to return to the rough-chamfering reference position.

Thus, the rough-chamfering for the circular part C of the wafer W is completed. Then, the finish-chamfering for the circular part C of the wafer W is started.

When the wafer W returns to the rough-chamfering reference position, the Z-axis motor 94 is run to move up the wafer W by the predetermined amount, so that the wafer W held on the wafer table 100 is positioned at the same height as the groove 108b of the periphery fine-machining grindstone 108B (the finish-chamfering reference position).

Then, the Y-axis motor 64 is run to move the wafer W along the Y-axis toward the periphery fine-machining grindstone 108B. The Y-axis motor 64 is stopped when the wafer W moves by a predetermined distance and the circular part C of the wafer W comes into contact with the groove 108b of the rough-machining grindstone 108B. Then, the θ-axis motor 96 is run to rotate the wafer W about the θ-axis. Thus, the circular part C of the wafer W is finely chamfered by the rotating periphery fine-machining grindstone 108B as shown in FIGS. 9(a) and 9(b).

The wafer W is rotated a predetermined number of times, and then, the θ-axis motor 96 is stopped to finish the finish-chamfering for the circular part C of the wafer W. The wafer W stops rotating at the finish-chamfering start position (the position where the wafer W comes into contact with the periphery fine-machining grindstone 108B for the first time). Then, the wafer W moves along the Y-axis by the predetermined amount away from the periphery fine-machining grindstone 108B to return to the finish-chamfering reference position, and the periphery motor 104 is stopped to stop the rotation of the periphery machining grindstone 108.

Thus, the finish-chamfering for the circular part C of the wafer W is completed. Then, the rough-chamfering for the notch NO of the wafer W is started.

The Z-axis motor 94 is run to move up the wafer table 100 by a predetermined amount, so that the wafer W held on the wafer table 100 is positioned at the same height as the groove of the notch rough-machining grindstone 122A. Then, the θ-axis motor 96 is run to rotate the wafer W by 180°. Therefore, the notch NO is positioned oppositely to the notch machining grindstone 122. Then, the X-axis motor 78 is run to move the wafer W along the X-axis by a predetermined amount. This causes the notch NO to shift along the X-axis by a predetermined amount toward the notch rough-machining grindstone 122A. The position of the wafer W at this time will hereafter be referred to as the "notch rough-chamfering reference position."

Then, the notch motor 118 is run to start rotating the notch machining grindstone 122. At the same time, the Y-axis motor 64 is run to move the wafer W along the Y-axis toward the notch rough-machining grindstone 122A. The Y-axis motor 64 is stopped when the wafer W is moved by a predetermined amount and a first notch corner $NR_1$ of the wafer W comes into contact with a groove (not shown) of the notch rough-machining grindstone 122A as shown in FIG. 9(c). Then, the wafer W is moved along the X-axis and the Y-axis so that the first notch corner $NR_1$ can be chamfered. More specifically, the wafer W is moved in such a manner that the first notch corner $NR_1$ is always in contact with the notch machining grindstone 122. Thus, the first notch corner $NR_1$ of the wafer W is roughly chamfered by the notch rough-machining grindstone 122A.

After the rough-chamfering for the first notch corner $NR_1$, the wafer W is moved continuously along the X-axis and the Y-axis so that the notch NO can be chamfered. More specifically, the wafer W is moved so that the notch NO can always be in contact with the notch rough-machining grindstone 122A as shown in FIG. 9(d). In FIG. 9(d), the wafer W moves in such a way as to describe the letter V since the notch NO is V-shaped.

After the chamfering for the notch NO, a second notch corner $NR_2$ of the wafer W comes into contact with the notch rough-machining grindstone 122A as shown in FIG. 9(e). Then, the second notch corner $NR_2$ is chamfered continuously. More specifically, the wafer W is moved along the X-axis and the Y-axis so that the second notch corner $NR_2$ can always be in contact with the notch rough-machining grindstone 122A. Thus, the second notch corner $NR_2$ of the wafer W is roughly chamfered.

After the chamfering of the second notch corner $NR_2$, the wafer W stops moving temporarily. Then, the chamfering is performed in reverse direction for the second notch corner $NR_2$, the notch NO and the first notch corner $NR_1$.

The above-described steps are repeated multiple times, and the rough chamfering for the notch NO and the notch corners NR is completed.

After the rough-chamfering for the notch NO, the wafer W stops at the notch chamfering start position indicated in FIG. 9(c). Then, the wafer W moves along the Y-axis away from the notch machining grindstone 122 to return to the notch rough-chamfering reference position.

Thus, the rough-chamfering for the notch NO and the notch corners NR of the wafer W is completed. Then, the finish-chamfering for the notch NO and the notch corners NR of the wafer W is started.

The Z-axis motor 94 is run to move up the wafer table 100 by a predetermined amount, so that the wafer W on the wafer table 100 is positioned at the same height as the groove of the notch fine-machining grindstone 122B. The position of the wafer W at this time will hereafter be referred to as the "notch finish-chamfering reference position."

Then, the Y-axis motor 64 is run to move the wafer W along the Y-axis toward the notch fine-machining grindstone 122B. The Y-axis motor 64 is stopped when the wafer W moves by a predetermined amount and the notch corner NR of the wafer W comes into contact with the groove (not shown) of the notch fine-machining grindstone 122B as shown in FIG. 9(c). Thereafter, the notch NO and the notch corners NR are finely chamfered by controlling the movement of the wafer W along the X-axis and the Y-axis in the same manner as in the rough-chamfering.

After the finish-chamfering of the wafer W, the wafer W stops rotating at the notch chamfering start position indicated in FIG. 9(c). Then, the wafer W moves along the Y-axis by a predetermined amount away from the notch fine-machining grindstone 122B to return to the notch finish-chamfering reference position, and the notch motor 118 is stopped to stop the rotation of the notch machining grindstone 122.

When the wafer W returns to the notch finish-chamfering reference position, the wafer table 100 moves on the X-axis by a predetermined amount and moves up along the Z-axis by a predetermined amount so that it can be positioned at the wafer receiving position. Then, the second transfer arm 32B of the transfer part 18 above the wafer table 100 moves down by the predetermined amount. After the wafer table 100 relieves the wafer W of the suction, the second transfer arm 32B picks up the wafer W from the wafer table 100. The second transfer arm 32B transfers the wafer W to the cleaning part 22.

Thus, the rough-chamfering and the finish-chamfering for the circular part C, the notch NO and the notch corners NR are completed.

According to the wafer chamfering apparatus 10, the wafer is rotated about the θ-axis and moved along the three axes X, Y and Z so that the periphery of the wafer W can be chamfered. On the other hand, the grindstone is rotated only. It is therefore possible to secure the stiffness of the periphery machining unit 44 and the notch machining unit 46 and to prevent the vibrations even if the periphery machining grindstone 108 or the notch machining grindstone 122 is rotated at a high speed. Consequently, the wafer W can be chamfered accurately.

Moreover, the wafer W and the grindstones can be rotated at high speeds without lowering the accuracy of the chamfering, and this improves the grinding efficiency.

In addition, compared with the conventional apparatus, which moves the heavyweight grindstone, it is easier to finely adjust the relative positions of the wafer W and the grindstone since the wafer W can be moved. This improves the positioning accuracy of the wafer W and the grooves of each grindstone, and improves the machining accuracy.

Furthermore, when the orientation flat OF or the notch NO of the wafer W is chamfered, the wafer W is moved straight so that the orientation flat OF or the notch NO can always be in contact with the periphery machining grindstone 108. Therefore, the wafer W can be chamfered with a high straightness. Likewise, when the orientation flat corners OR or the notch corners NR are chamfered, the wafer W is moved so that the orientation flat corners OR or the notch corners NR can always be in contact with the periphery machining grindstone 108. Thus, it is easy to chamfer the wafer W with a high straightness.

In this embodiment, the whole circumference of the wafer W with the orientation flat is continuously chamfered; but it is also possible to separately chamfer each part of the wafer W. For example, only the circular part C of the wafer W is chamfered at first, then the orientation flat OF is chamfered, and the orientation flat corners OR are chamfered at last.

The machining order is not restricted to this embodiment. For example, the orientation flat OF may be chamfered first, then the orientation flat corners OR may be chamfered, and the circular part C may be chamfered at last. In the case of the wafer with the notch, the notch NO and the notch corners NR may be chamfered first, and then, the circular part C may be chamfered.

In the wafer chamfering apparatus 10 of this embodiment, the rough-machining grindstones and the fine-machining grindstones, which are connected coaxially, are used in order to perform the rough-chamfering and the finish-chamfering in one chamfering operation. However, it is also possible to use only the rough-machining grindstone, or only the fine-machining grindstone. In this case, the apparatus is only used for the rough-machining or the fine-machining.

In this embodiment, the two types of grindstones are used, but it is also possible to connect a variety of grindstones, which are different in grain size, to thereby chamfer the wafer step by step. In this embodiment, each grindstone has only one groove, but it is also possible to use grindstones with a plurality of grooves.

Figure 10:
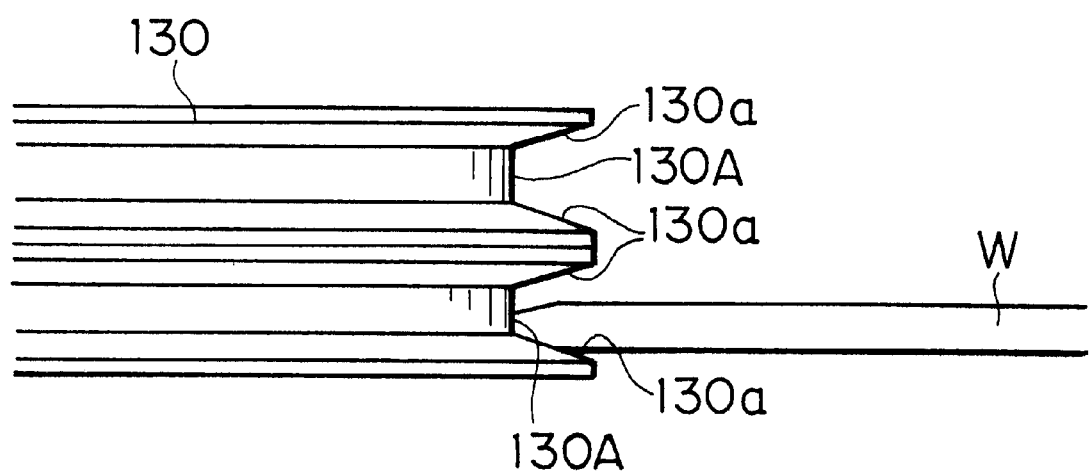
FIG. 10 is a side view showing a grindstone according to another embodiment.

In this embodiment, the formed grindstones are used, but it is also possible to use a grindstone 130 with trapezoid grooves 130A at the periphery thereof as shown in FIG. 10. In FIG. 10, one of the upper and lower edges of the wafer W is pressed against a sloping surface 130*a* of the grooves 130A, so that the wafer W is chamfered on an edge-by-edge basis.

A description will be given of a wafer chamfering method according to the present invention. The wafer chamfering apparatus 10 is used in this method (except for a wafer chamfering method in the seventh and eighth embodiments). For the sake of convenience, an explanation will be given only of the step of chamfering the wafer W at the first machining part 20A, whereas explanations of the feeding step, the cleaning step, etc. will be omitted.

A description will now be given of the first embodiment of the wafer chamfering method according to the present invention.

In the initial state prior to the start of machining, the wafer table 100 is positioned at a predetermined distance from the periphery machining grindstone 108 and the rotational axis θ is on the Y-axis. The wafer table 100 is also positioned at a predetermined height with respect to the periphery machining grindstone 108.

A transfer apparatus (not shown) places the wafer W on the wafer table 100 so that the center $O_W$ of the wafer W can correspond to the rotational axis θ of the wafer table 100 and the notch NO of the wafer W can be positioned on the Y-axis. The center $O_W$ of the wafer W placed on the wafer table 100 is positioned on the Y-axis, and the wafer W is at a predetermined distance from the periphery machining grindstone 108. The wafer W placed on the wafer table 100 is at the same height as the lower groove 108*a* of the periphery machining grindstone 108. The position of the wafer W before the chamfering will hereinafter be referred to as a "reference position."

Then, the wafer W placed on the wafer table 100 is held by suction, and the chamfering is started. The periphery of the wafer W (the circular part C of the wafer W) is chamfered first. FIGS. 11(*a*)–11(*d*) show the procedure for chamfering the circular part C of the wafer W.

The periphery motor 104 and the θ-motor 96 are run. This causes the periphery machining grindstone 108 and the wafer table 100 to rotate at high speeds in the same direction.

The circumferential speed of the periphery machining grindstone 108 is determined in accordance with measured vibrations generated when the periphery machining grindstone 108 is rotating at a high speed. The excessively low speed does not achieve the desired effect of the present invention, and the excessively high speed causes the vibrations to affect the machined surface of the wafer W. Thus, the circumferential speed of the periphery machining grindstone 108 is 1,000 [m/min] or more, and more preferably, between 1500 and 3000 [m/min].

The circumferential speed of the wafer W held on the wafer table 100 is determined in accordance with the amount of material removed from the wafer W, which is calculated from the grain size and the circumferential speed of the periphery machining grindstone 108. Since the excessively low speed cannot achieve the desired effect of the present invention, the wafer table 100 is rotated so that the circumferential speed of the wafer W can be 30 [m/min] or more, and more preferably, between 100 and 1,000 [m/min].

When the rotations of the periphery machining grindstone 108 and the wafer table 100 are stabilized, the Y-axis motor 64 is run to move the wafer W along the Y-axis toward the periphery machining grindstone 108. The moving speed of the wafer W is reduced just before the wafer W comes into contact with the periphery machining grindstone 108, and then, the wafer W is slowly fed to the periphery machining grindstone 108.

The feed speed of the wafer W is determined in accordance with the damage of the machined surface of the wafer W, which is calculated in an experiment. The feed speed of the wafer W is preferably between 0.01 and 0.05 [mm/min]. In this embodiment, the wafer W is fed at a speed of substantially 0.02 [mm/sec].

The periphery of the wafer W comes into contact with the groove 108*a* of the periphery machining grindstone 108 as shown in FIG. 11(*b*). Thereafter, the wafer W is fed at the predetermined feed speed (substantially 0.02 [mm/sec]) to the periphery machining grindstone 108. Thus, the circular part C of the wafer W is gradually chamfered by the periphery machining grindstone 108.

As shown in FIG. 11(*c*), the wafer W is fed until the distance between the centers of the periphery machining grindstone 108 and the wafer table 100 reaches a predetermined distance L. When the distance reaches the predetermined distance L, the Y-axis motor 64 is stopped and is then run in the opposite direction, so that the wafer W moves along the Y-axis away from the periphery machining grindstone 108 as shown in FIG. 11(*d*) to return to the reference position. When the wafer W returns to the reference position, the θ-axis motor 96 and the periphery motor 104 are stopped to stop the rotations of the wafer table 100 and the periphery machining grindstone 108.

Thus, the circular part C of the wafer W is completed. Then, the notch NO of the wafer is chamfered.

The notch NO of the wafer W at the reference position is positioned on the Y-axis as shown in FIG. 11(*d*). In this state, the Z-axis motor 94 is run to raise the wafer table 100 by a predetermined amount, so that the wafer W is positioned at the same height as the lower groove of the notch machining grindstone 122. Then, the X-axis motor 78 is run to move the wafer W along the X-axis by a predetermined amount, so that the notch corner NR$_1$ of the wafer W is positioned on the Y-axis as shown in FIG. 12(a). The position of the wafer W at this time will hereafter be referred to as a "notch machining reference position."

Then, the notch motor 118 is run to rotate the notch machining grindstone 122 at a high speed. At the same time, the Y-axis motor 64 is run to move the wafer W toward the notch machining grindstone 122.

After the wafer W moves by a predetermined distance, the notch corner NR$_1$ of the wafer W comes into contact with the groove of the notch machining grindstone 122 as shown in FIG. 12(b). Then, the X-axis motor 78 and the Y-axis motor 64 are run at the same time to feed the wafer W along the X-axis and the Y-axis. The wafer W is fed so that the notch corner NR$_1$ can always be in contact with the notch machining grindstone 122. Thus, the notch corner NR$_1$ can be chamfered.

After the chamfering for the notch corner NR, the wafer W is fed continuously along the X-axis and the Y-axis to chamfer the notch NO. More specifically, the wafer W is fed in such a manner that the notch NO is always in contact with the notch machining grindstone 122 as shown in FIG. 12(c). In FIG. 12(c), the wafer W is fed in such a way as to describe the letter V since the notch NO is V-shaped. Thus, the V-shaped notch NO is chamfered.

After the chamfering for the notch NO, the notch corner NR$_2$ of the wafer W comes into contact with the notch machining grindstone 122. Then, the notch corner NR$_2$ is chamfered continuously. More specifically, the wafer W is fed along the X-axis and the Y-axis so that the notch corner NR$_2$ is always in contact with the notch machining grindstone 122. Thus, the notch corner NR$_2$ of the wafer W is chamfered.

After the chamfering for the notch corner NR$_2$, the wafer W is temporarily stopped. Then, the wafer W is fed in the reverse procedure so that the notch NO and the notch corners NR can be chamfered in reverse order.

The above-described operation is repeated multiple times to chamfer the notch NO and the notch corners NR.

After the chamfering for the notch NO and the notch corners NR, the wafer W stops at the notch chamfering start position indicated in FIG. 12(b). Then, the wafer W moves by a predetermined amount away from the notch machining grindstone 122 to return to the notch machining reference position indicated in FIG. 12(a). Then, the wafer W moves along the X-axis by a predetermined amount and also moves down along the Z-axis by a predetermined amount to return to the reference position, and the notch motor 118 is stopped to stop rotating the notch machining grindstone 122.

That completes the chamfering for the circular part C, the notch NO and the notch corners NR of the wafer W. When the wafer W returns to the reference position, the wafer table 100 relieves the wafer W of the suction. Then, the transfer apparatus (not shown) picks up the wafer W from the wafer table 100 and transfers it to the next stage.

In the wafer chamfering method of this embodiment, the periphery machining grindstone 108 and the wafer W are rotated at high speeds in the same direction and the wafer W is slowly fed to the periphery machining grindstone 108 to thereby chamfer the periphery of the wafer W This increases the relative circumferential speed of the periphery machining grindstone 108 with respect to the wafer W (the sum of the circumferential speed of the wafer W and the circumferential speed of the periphery machining grindstone 108) to thereby increase the machining speed and reduce the machining period.

The rotating wafer W is slowly fed to the periphery machining grindstone 108 so that the periphery machining grindstone 108 can slowly grind the wafer W. Since the periphery of the wafer W is slowly ground, the wafer W is damaged only a little. Therefore, the machined surface of the wafer W can be accurate.

In this embodiment, the notch NO is chamfered after the circular part C of the wafer W is chamfered, but the chamfering may also be performed in reverse order.

In this embodiment, the wafer W is only moved along the Y-axis to come into contact with the periphery machining grindstone 108, but the wafer W may also be moved along the X-axis and the Y-axis to come into contact with the periphery machining grindstone 108.

In this embodiment, the present invention is applied to an apparatus that chamfers the wafer W by moving the wafer W, but the present invention may also be applied to an apparatus that chamfers the wafer W by moving the periphery machining grindstone 108 or an apparatus that chamfers the wafer W by moving both the wafer W and the periphery machining grindstone 108. If the present invention is applied to the apparatus, in which the periphery machining grindstone 108 of the machining part 20A is fixed and only rotates like the wafer chamfering apparatus 10 of this embodiment, the apparatus has enough stiffness and prevent the vibrations of the periphery machining grindstone 108. This improves the accuracy of the machined surface of the wafer W A description will now be given of the second embodiment of the wafer chamfering method according to the present invention. FIGS. 13(a)–13(f) show the procedure in the second embodiment of the wafer chamfering method according to the present invention.

The transfer apparatus (not shown) places the wafer W on the wafer table 100 so that the center O$_W$ of the wafer W is positioned on the Y-axis and at a predetermined distance from the periphery machining grindstone 108 as shown in FIG. 13(a). The wafer W is positioned at the same height as the lower groove 108a of the periphery machining grindstone 108. The position of the wafer W at this time will hereafter be referred to as the "first reference position." When the wafer W is placed on the wafer table 100, the wafer W is held on the wafer table 100 by suction.

Then, the X-axis motor 78 is run to move the wafer W along the X-axis as shown in FIG. 13(b). The X-axis motor 78 is stopped when the wafer W moves by a predetermined distance. The position of the wafer W at this time will hereafter be referred to as the "second reference position."

Then the Y-axis motor 64 is run to move the wafer W along the Y-axis as shown in FIG. 13(c). The Y-axis motor 64 is stopped when the distance between the centers of the wafer W and the periphery machining grindstone 108 along the Y-axis reaches a predetermined distance D. The position of the wafer W at this time will hereafter be referred to as the "machining start position." The distance D between the centers of the wafer W and the periphery machining grindstone 108 along the Y-axis is determined as D=R$_G$+R$_1$, where R$_G$ is the radius of the periphery machining grindstone 108, and R$_1$ is the radius of the wafer W after chamfered. In FIG. 13(c), ζ is a predetermined reduction of the radius of the wafer W to be caused by the chamfering, that is, ζ=R$_0$−R$_1$, where R$_0$ is the radius of the wafer W not chamfered yet.

Then, the periphery motor 104 and the θ-axis motor 96 are run to rotate the periphery machining grindstone 108 and the wafer table 100 in the same direction at high speeds. The periphery machining grindstone 108 is rotated at a circumferential speed of 1000 [m/min] or more, and more preferably, between 1500 and 3000 [m/min]. The wafer table 100 is run so that the wafer W can be rotated at a circumferential speed of 30 [m/min] or more, and more preferably, between 100 and 1000 [m/min].

Then, the X-axis motor 78 is run to move the wafer W along the X-axis toward the periphery machining grindstone 108. The moving speed of the wafer W is reduced just before the periphery thereof comes into contact with the groove 108a of the periphery machining grindstone 108. Then, the wafer W is slowly fed along the X-axis at a predetermined feeding speed (about 0.02 [mm/sec]). Thus, the periphery of the wafer W comes into contact with the periphery machining grindstone 108 as shown in FIG. 13(d) and is gradually chamfered. The wafer W stops when the center $O_W$ thereof is positioned on the Y-axis as shown in FIG. 13(e). The position of the wafer W at this time will hereafter be referred to as the "machining ending position."

When the wafer W reaches the machining ending position, the Y-axis motor 64 is run to move the wafer W away from the periphery machining grindstone 108. The Y-axis motor 64 is stopped when the wafer W reaches the first reference position as shown in FIG. 13(f). Then, the θ-axis motor 96 and the periphery motor 104 are stopped to stop rotating the wafer table 100 and the periphery machining grindstone 108.

That completes the chamfering for the periphery of the wafer W. When the wafer W returns to the first reference position, the wafer table 100 relieves the wafer W of the suction and the transfer apparatus (not shown) picks up the wafer W from the wafer table 100 and transfers it to the next stage as it is.

In the wafer chamfering method of the second embodiment, the periphery of the wafer W is chamfered by moving the wafer W while the distance D along the Y-axis between the centers of the wafer W and the periphery machining grindstone 108 is maintained. In this method, the amount of the material removed from the wafer W by the periphery machining grindstone 108 is decreased as the center $O_W$ of the wafer W becomes closer to the Y-axis (in the first embodiment, the amount of the material removed from the wafer W by the periphery machining grindstone 108 is almost constant from the start of machining to the end of machining if the wafer W is fed at a constant speed). This reduces the damage on the machined surface of the wafer W just before the completion of chamfering, and improves the accuracy of the machined surface of the wafer W.

In this embodiment, the wafer W is fed at a constant feed speed (about 0.02 [mm/sec]). It is also possible to feed the wafer W at a high speed (about 0.2 [mm/sec]) since amount of the material removed from the wafer W by the periphery machining grindstone 108 is decreased as the center $O_W$ of the wafer W becomes closer to the Y-axis. In addition, it is possible to gradually increase the feed speed after the wafer W comes into contact with the periphery machining grindstone 108. This reduces the machining period while maintaining the accuracy of the machined surface of the wafer W.

In this embodiment, the wafer W without the notch is chamfered, but the circular part of the wafer W with the notch can be chamfered in the same manner. In this case, the notch is chamfered in the same manner as in the first embodiment before or after the chamfering for the circular part.

In this embodiment, the distance D is determined to be the sum of the radius $R_G$ of the periphery machining grindstone 108 and the radius $R_1$, of the chamfered wafer W, but the present invention should not be restricted to this. For example, if the distance D is determined to be less than the sum ($R_G$30 $R_1$), the wafer W is fed along the X-axis and is stopped when the wafer W is ground at the predetermined radius ($R_1$).

In this embodiment, the wafer W is moved along the X-axis only to come into contact with the periphery machining grindstone 108, but the wafer W may be moved along both the X-axis and the Y-axis to come into contact with the periphery machining grindstone 108.

In this embodiment, the present invention is applied to an apparatus that chamfers the wafer W by moving the wafer W, but the present invention may also be applied to an apparatus that chamfers the wafer W by moving the periphery machining grindstone 108 or an apparatus that chamfers the wafer W by moving both the wafer W and the periphery machining grindstone 108. If the present invention is applied to the apparatus, in which the periphery machining grindstone 108 of the machining part 20A is fixed and only rotates like the wafer chamfering apparatus 10 of this embodiment, the apparatus has enough stiffness and prevent the vibrations of the periphery machining grindstone 108. This improves the accuracy of the machined surface of the wafer W.

A description will now be given of the third embodiment of the wafer chamfering method according to the present invention.

In the first and second embodiments, the wafer W is fed at a constant speed. In the third embodiment, the wafer W is fed by a predetermined distance, then is stopped and waits for a predetermined period, and these steps are repeated. More specifically, the wafer W is chamfered as described below.

The feed speed of the wafer W is reduced just before the wafer W comes into contact with the periphery machining grindstone 108, and then, the wafer W is fed at a predetermined feed speed (about 0.02 [mm/sec]) to the periphery machining grindstone 108. After the wafer W moves by a predetermined distance, the wafer W is stopped and waits for a predetermined period. Then, the wafer W is fed again at the predetermined feed speed to the periphery machining grindstone 108, and is stopped after moving by the predetermined distance. The wafer W waits at that position for the predetermined period, and is fed again at the predetermined feed speed to the periphery machining grindstone 108. This is repeated to perform a so-called spark-out grinding.

Chamfering the wafer W while controlling the feed thereof in the above-mentioned manner improves the machining accuracy. The periphery of the wafer W is elastically deformed during the wafer W is being fed to the periphery machining grindstone 108. While the wafer W is stopped, the deformed part of the wafer W gradually returns and is gradually ground by the periphery machining grindstone 108. It is therefore possible to smoothen the machined surface of the wafer W.

This chamfering method is particularly advantageous when the present invention is applied to an apparatus that cannot easily feed the wafer W at a low speed (or an apparatus that cannot easily feed the grindstone at a low speed). This chamfering method may be applied to the first and second embodiments.

A description will be given of the fourth embodiment of the wafer chamfering method according to the present invention.

In the first and second embodiments, the wafer W is rotated at a constant circumferential speed. In the fourth embodiment, the wafer W is rotated at a low speed for the fine-machining. The wafer W is chamfered as described below.

In the first embodiment of the wafer chamfering method modified in accordance with the fourth embodiment, the rotational speed of the wafer table 100 is reduced just before the distance between the centers of the periphery machining grindstone 108 and the wafer table 100 reaches a predetermined distance L (the rotational speed of the wafer table 100 is reduced at a position where the distance between the centers of the periphery machining grindstone 108 and the wafer table 100 is L+δ, where δ is a very short distance) so that the wafer W can be rotated at a low speed (the circumferential speed of the wafer W is 0.3–3 [m/min]). Then, the wafer W is fed by the distance δ so that the distance between the centers of the periphery machining grindstone 108 and the wafer table 100 reaches the predetermined distance L, and the wafer W is made one rotation as it is.

In the second embodiment of the wafer chamfering method modified in accordance with the fourth embodiment, the rotational speed of the wafer table 100 is reduced just before the center $O_W$ of the wafer W is positioned on the Y-axis (the rotational speed of the wafer table 100 is reduced at a position where the distance between the center $O_W$ of the wafer W and the Y-axis is δ) so that the wafer W can be rotated at a low speed (the circumferential speed of the wafer W is 0.3–3 [m/min]). Then, the wafer W is fed by the distance δ so that the center $O_W$ of the wafer W is positioned on the Y-axis, and the wafer W is made one rotation as it is.

In the fourth embodiment, it is possible to prevent the revolution marks, which are striped patterns on the machined surface of the wafer W, even if the periphery machining grindstone 108 is vibrating.

A description will now be given of the fifth embodiment of the chamfering method according to the present invention.

In the first and second embodiments, the wafer W is rotated at a constant high circumferential speed. In the fifth embodiment of the wafer chamfering method, the circumferential speed of the wafer W is changed periodically within a high speed range. More specifically, the wafer W is machined as described below.

Figure 14:
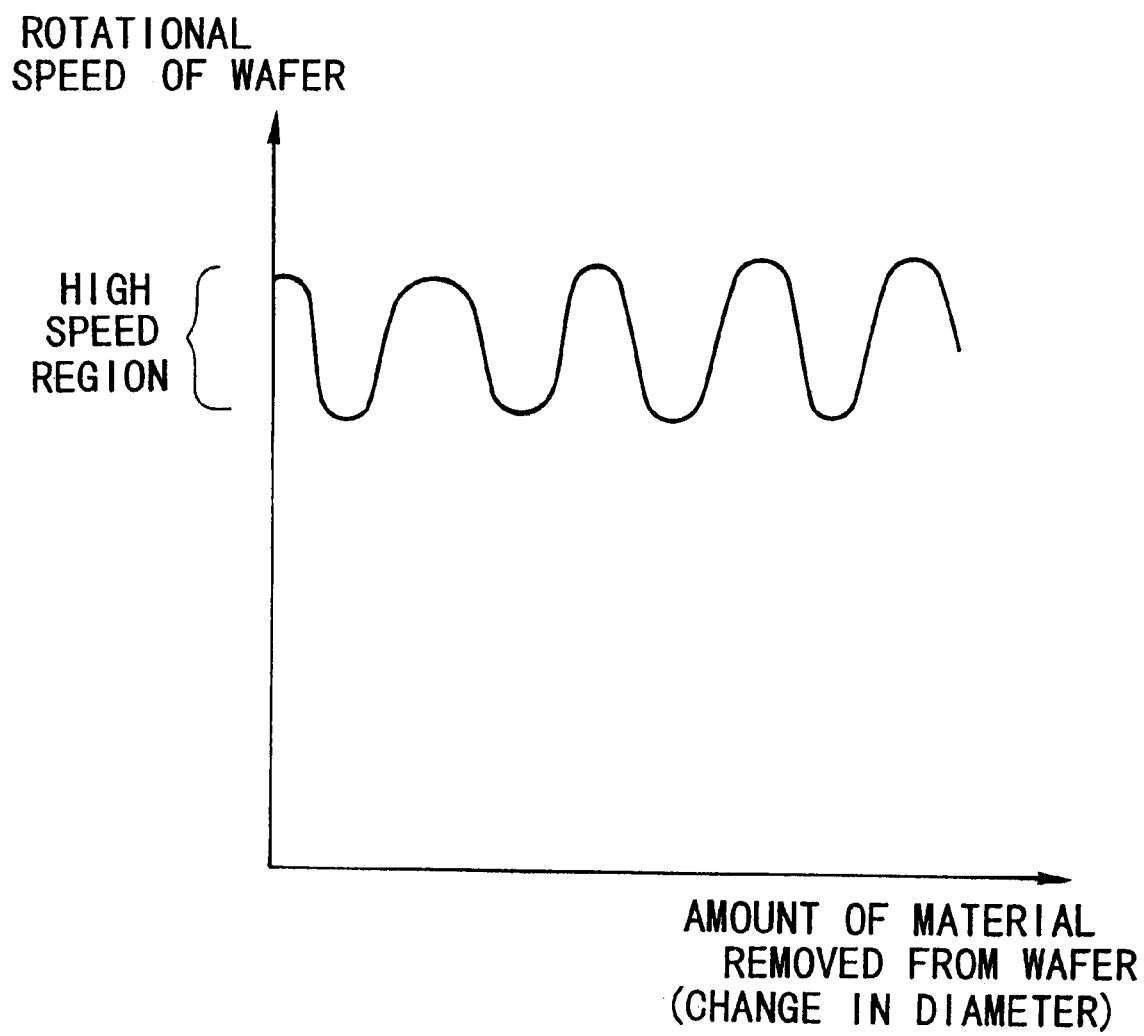
FIG. 14 is a graph of assistance in explaining the operation of the fifth embodiment.

As shown in FIG. 14, the circumferential speed of the wafer W is changed periodically within a high speed range (30 [m/min] or more, and more preferably, between 100 and 1000 [m/min]) according to the amount of material removed from the wafer W.

As is the case with the fourth embodiment, the wafer chamfering method of the fifth embodiment prevents the revolution marks on the machined surface of the wafer W even if the periphery machining grindstone 108 is vibrating. The wafer chamfering method of the fifth embodiment may be applied to the first and second embodiments.

A description will now be given of the sixth embodiment of the wafer chamfering method according to the present invention.

In the fifth embodiment, the circumferential speed of the wafer is changed periodically within a high speed range, but the wafer W is rotated in the same direction. In the wafer chamfering method of the sixth embodiment, the circumferential speed of the wafer W is changed periodically to machine the wafer W while it is rotated forward and backward. More specifically, the wafer W is machined as described below.

Figure 15:
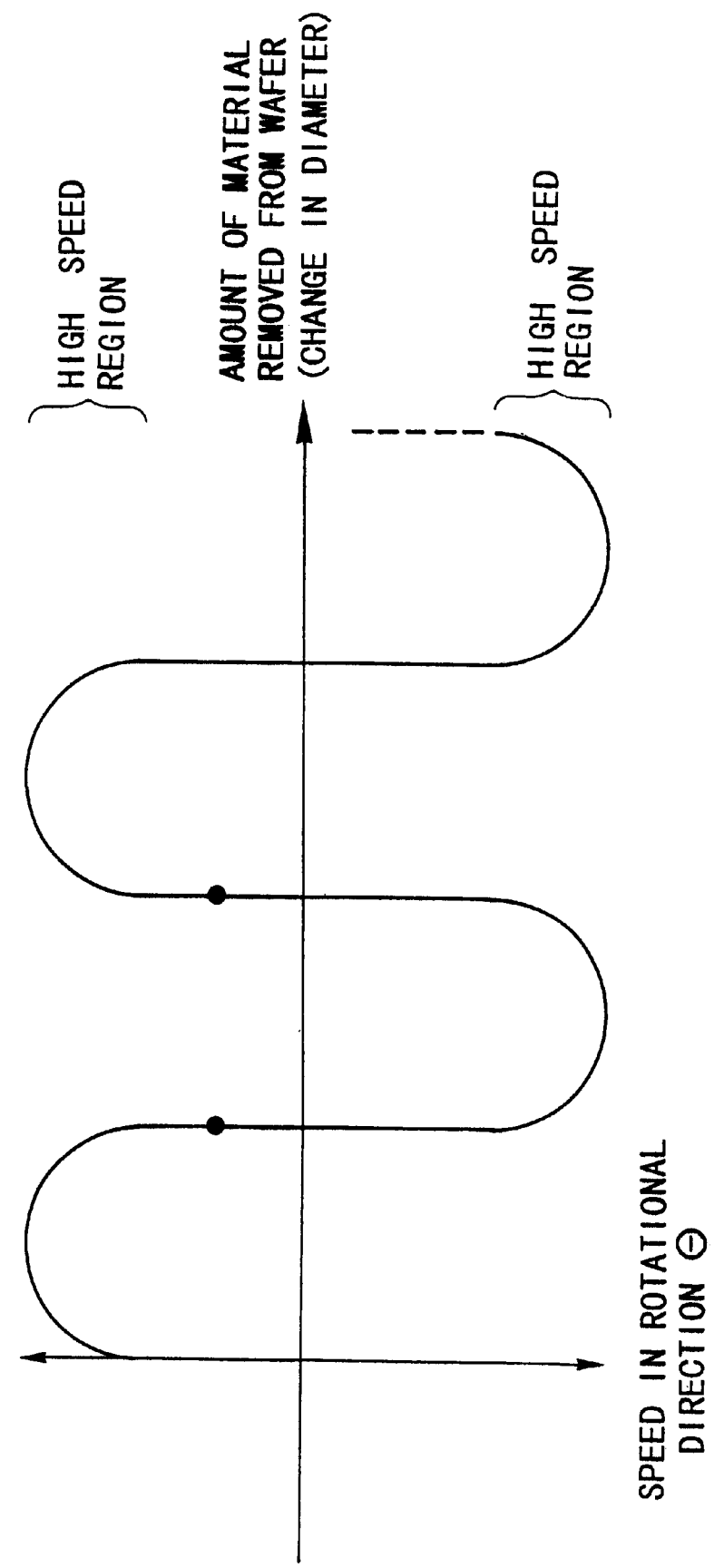
FIG. 15 is a graph of assistance in explaining the operation of the sixth embodiment.

As shown in FIG. 15, the circumferential speed of the wafer W is changed periodically according to the amount of material removed from the wafer W. The wafer W is machined while it is rotated forward and backward. In this case, the wafer W must be ground only when it is rotated at a high speed (30 [m/min] or more, and more preferably, between 100 and 1000 [m/min]). For this purpose, the wafer W is not fed when it is rotating at a low speed to change the rotational directions.

As is the case with the fourth and fifth embodiments, the wafer chamfering method of the sixth embodiment prevents the revolution marks on the machined surface of the wafer W even if the periphery machining grindstone 108 is vibrating. The wafer chamfering method of the sixth embodiment may be applied to the first and second embodiments.

A description will be given of the seventh embodiment of the wafer chamfering method according to the present invention.

A description will be given of the structure of a machining part of a wafer chamfering apparatus according to the seventh embodiment of the wafer chamfering method of the present invention.

Figure 16:
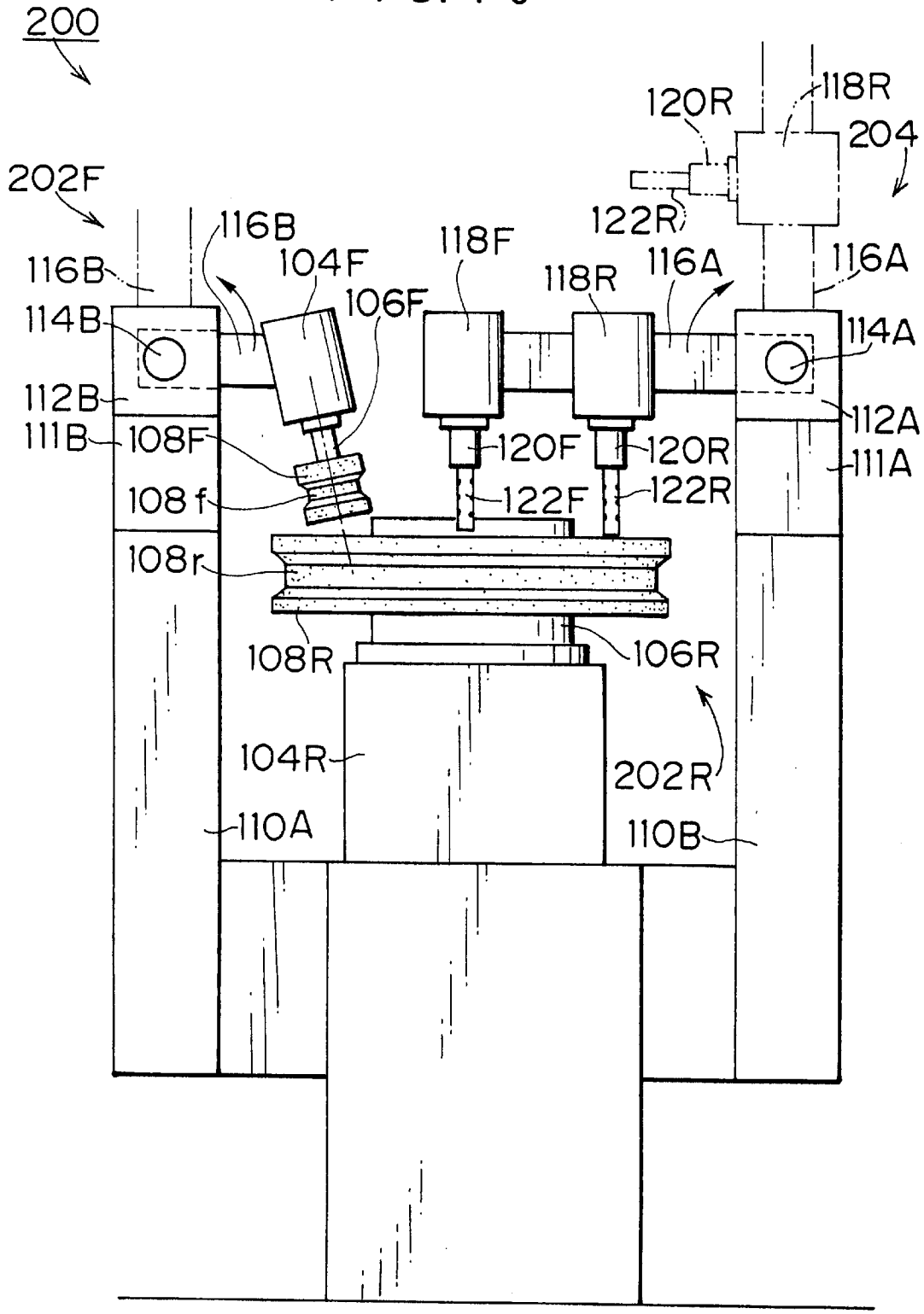
FIG. 16 is a front view showing the structure of a wafer chamfering apparatus.
Figure 17:
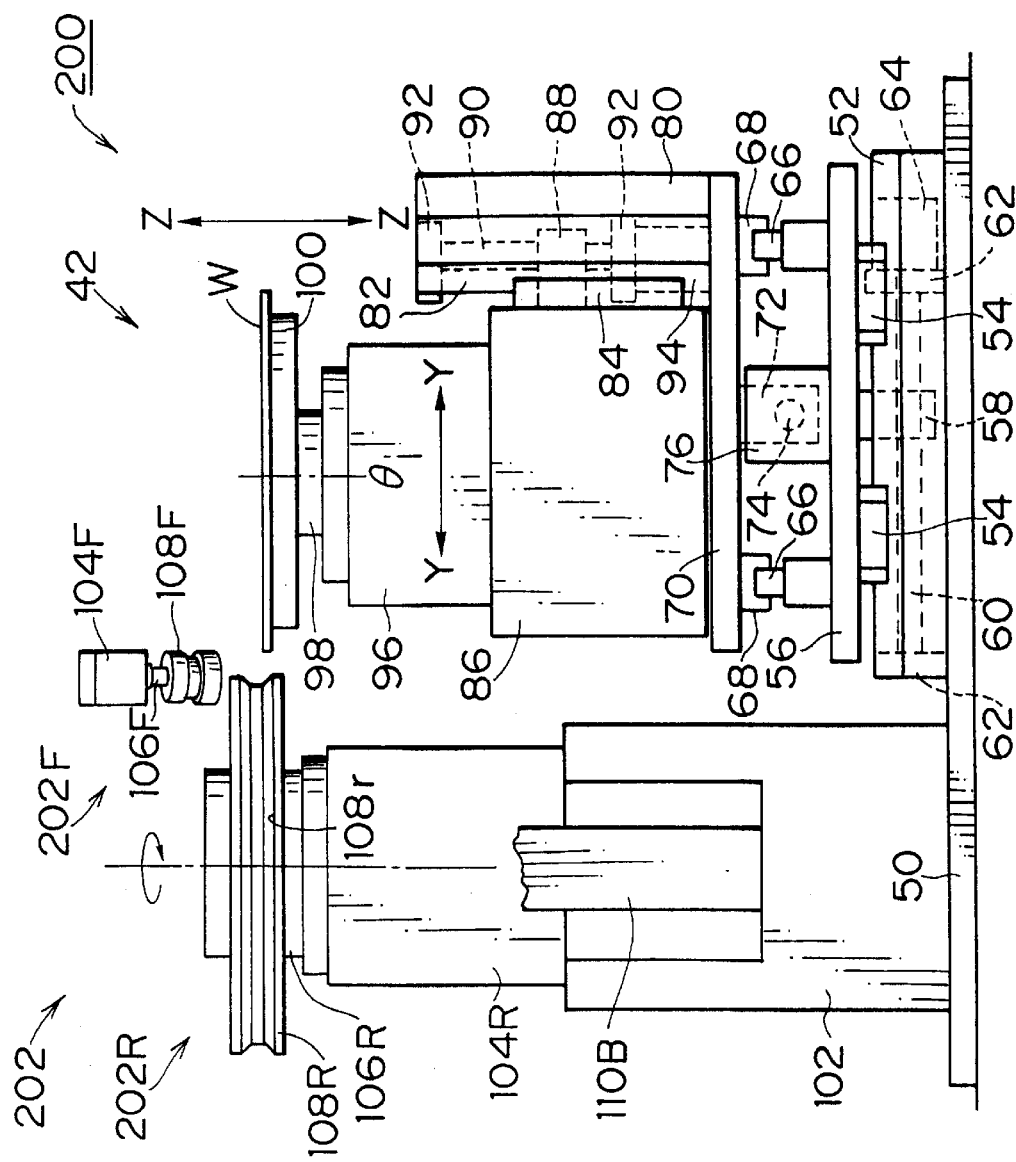
FIG. 17 is a side view showing the structure of the wafer chamfering apparatus.
Figure 18:
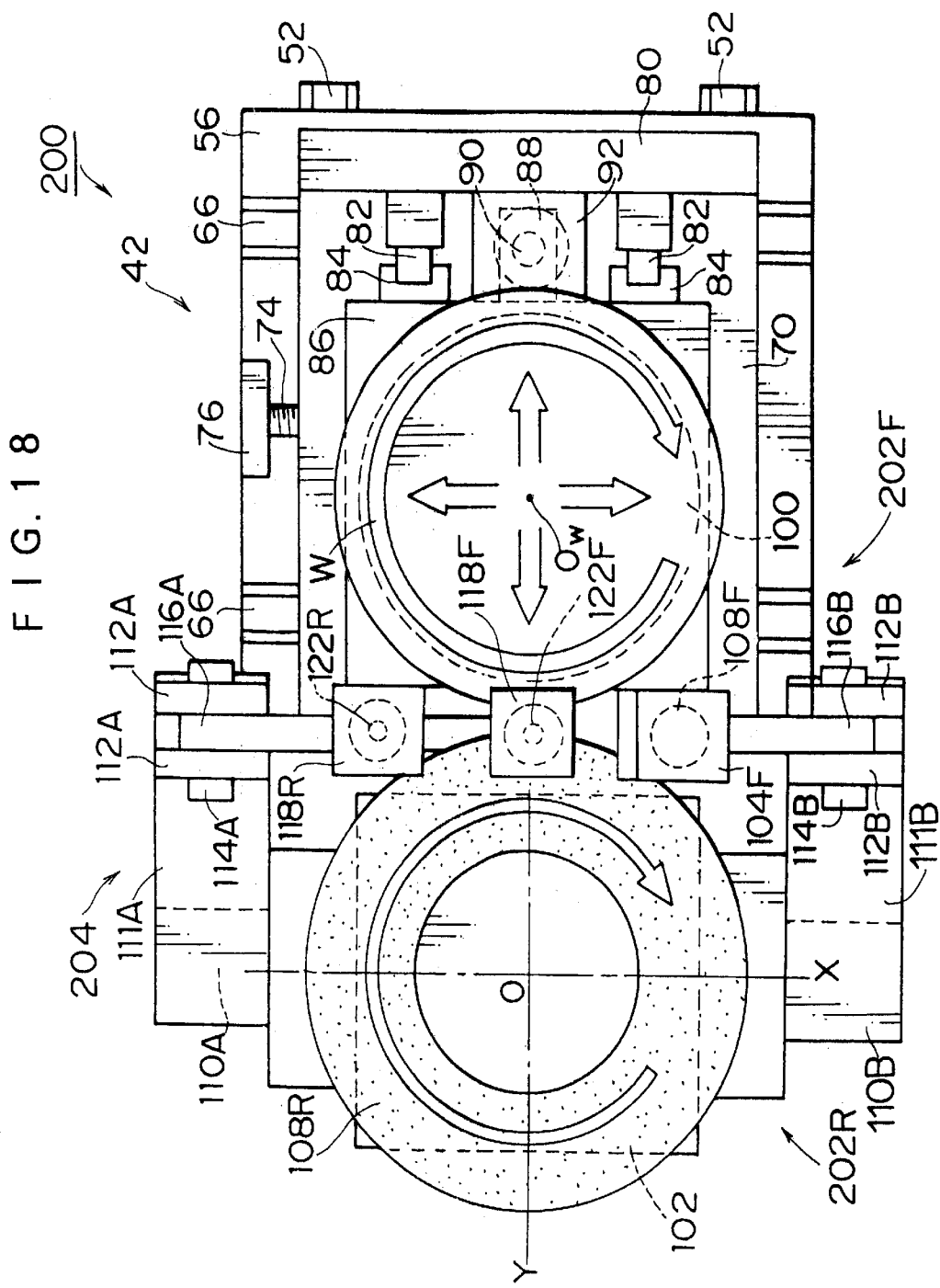
FIG. 18 is a plan view showing the structure of the wafer chamfering apparatus.

FIGS. 16–18 are a front view, a side view and a plan view, respectively, showing the structure of a machining part 200 of the wafer chamfering apparatus according to the seventh embodiment of the wafer chamfering method.

As shown in FIGS. 16–18, the machining part 200 of the wafer chamfering apparatus is different from that of the wafer chamfering apparatus 10 in the structure of a periphery machining unit 202 and a notch machining unit 204. Hence, a description will be given only of the structure of the periphery machining unit 202 and the notch machining unit 204. The other components are denoted by the same reference numerals as in the wafer chamfering apparatus 10, and they will not be explained here.

The periphery machining unit 202 is composed of a periphery rough-machining apparatus 202R and a periphery fine-machining apparatus 202F.

A description will be given of the structure of the periphery rough-machining apparatus 202R. A periphery rough-machining motor 104R is vertically disposed on the base 102 on the base plate 50. A periphery rough-machining spindle 106R connects to an output shaft of the periphery rough-machining motor 104R. A periphery rough-machining grindstone 108R for roughly chamfering the periphery of the wafer W is mounted on the periphery rough-machining spindle 106R. A groove 108r with a trapezoidal section is formed at the periphery of the periphery rough-machining grindstone 108R. The periphery of the wafer W is chamfered while it is pressed against the groove 108r (such a grooved grindstone is called a "T-shaped grindstone").

A description will be given of the structure of the periphery fine-machining apparatus 202F (which is equivalent to the periphery machining unit 44 of the wafer chamfering apparatus 10). A pair of supports 109A & 109B is vertically disposed at both sides of the base 102. The bottom ends of the supports 109A & 109B are fixed at both sides of the base 102. Horizontal beams 111A & 111B are integrated with the top ends of the supports 109A & 109B. Bearing members 112A & 112B are arranged at the ends of the beams 111A & 111B. The bearing members 112A & 112B support arms 116A & 116B swingably through pins 114A & 114B. A lock means (not shown) can lock the arm 116A, and the arm 116A can be fixed horizontally by the lock means as shown in FIG. 16. A lock means (not shown) can lock the arm 116B, and the arm 116B can be fixed horizontally by the lock means as shown in FIG. 16.

A periphery fine-machining motor 104F is disposed at the arm 116B. A periphery fine-machining spindle 106F connects to an output shaft of the periphery fine-machining motor 104F. A periphery fine-machining grindstone 108F for finely chamfering the periphery of the wafer W is mounted on the periphery fine-machining spindle 106F. The common rotational axis of the periphery fine-machining motor 104F, the periphery fine-machining spindle 106F and the periphery fine-machining grindstone 108F is inclined along the X-Z plane at a predetermined angle with respect to the Z-axis.

As shown in FIG. 16, the periphery fine-machining grindstone 108F has a smaller diameter than the periphery rough-machining grindstone 108R (the periphery rough-machining grindstone 108R has a diameter of 100–300 mm, whereas the periphery fine-machining grindstone 108F has a diameter of 2–50 mm). A groove 108f with a trapezoidal section is formed at the periphery of the periphery fine-machining grindstone 108F, and the periphery of the wafer W is chamfered while it is pressed against the groove 108f.

A description will be given of the structure of the notch machining unit 204. A notch rough-machining motor 118R and a notch fine-machining motor 118F are arranged at the end of the arm 116A. A notch rough-machining spindle 120R and a notch fine-machining spindle 120F connect to output shafts of the notch rough-machining motor 118R and the notch fine-machining motor 118F, respectively. A notch rough-machining grindstone 122R for roughly chamfering the notch is mounted on the notch rough-machining spindle 120R. On the other hand, a notch fine-machining grindstone 122F for finely chamfering the notch is mounted on the notch fine-machining spindle 120F. Although not shown in detail, grooves with trapezoidal sections are formed at the peripheries of the notch rough-machining grindstone 122R and the notch fine-machining grindstone 122F.

A description will now be given of the seventh embodiment of the wafer chamfering method according to the present invention, which uses the above-described machining part 200.

In the initial state before the start of machining, the wafer table 100 is located at a predetermined distance from the periphery rough-machining grindstone 108R with the rotational axis θ being positioned on the Y-axis. The wafer table 100 is positioned at a predetermined height with respect to the periphery rough-machining grindstone 108R.

The transfer apparatus (not shown) places the wafer W on the wafer table 100 so that the center $O_W$ of the wafer W can correspond to the rotational axis θ of the wafer table 100 and the notch NO can be positioned on the Y-axis. The center $O_W$ of the wafer W on the wafer table 100 is positioned on the Y-axis, and the wafer W is positioned at the predetermined distance from the periphery rough-machining grindstone 108R. The position of the wafer W before chamfering will hereafter be referred to as an "original position."

The wafer W is held on the wafer table 100 by suction, and then, the chamfering starts. The periphery (the circular part) of the wafer W is roughly chamfered at first.

The Z-axis motor 94 is run to move the wafer table 100 along the Z-axis by a predetermined amount, so that the wafer W placed on the wafer table 100 is positioned at the same height as the lower sloping surface of the groove 108r of the periphery rough-machining grindstone 108R. The position of the wafer W at this time will hereafter be referred to as a "lower edge rough-machining position."

Then, the periphery rough-machining motor 104R and the θ-axis motor are run to rotate the periphery rough-machining grindstone 108R and the wafer table 100 in the same direction at high speeds. Thereafter, the Y-axis motor 64 is run to move the wafer W along the Y-axis toward the periphery rough-machining grindstone 108R. At this time, the wafer W is moved at a high speed until just before it comes into contact with the periphery rough-machining grindstone 108R, and then, the wafer W is moved slowly.

Figure 19A:
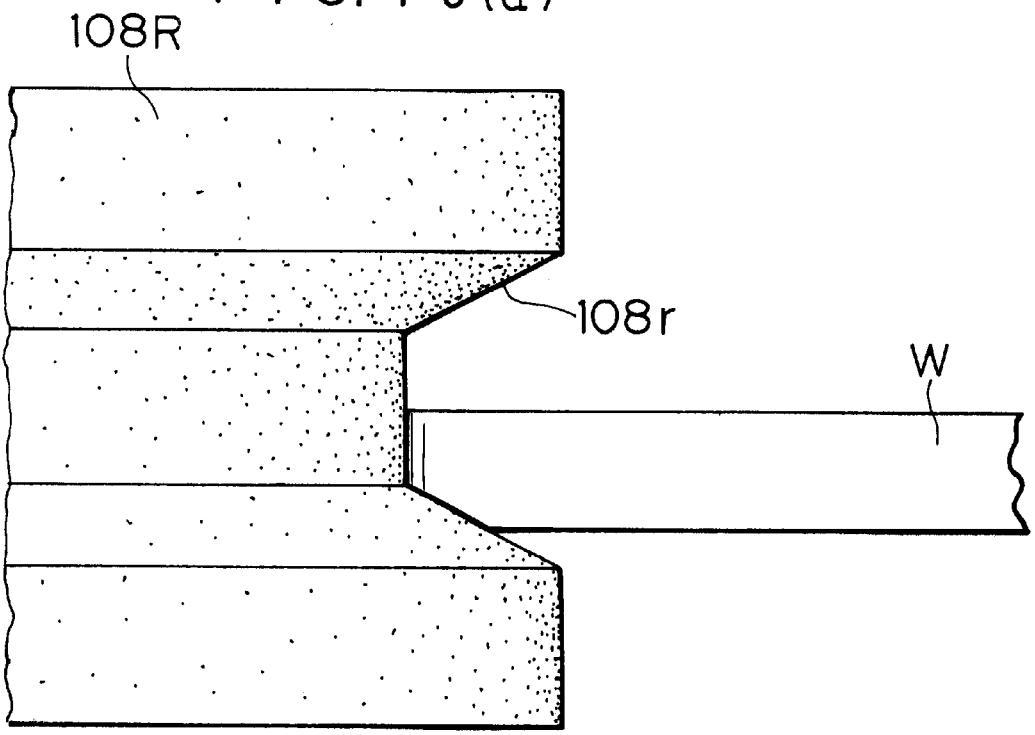
FIGS. 19(a) and 19(b) are explanation drawings showing a wafer chamfering method according to the seventh embodiment.

The periphery of the wafer W comes into contact with the lower sloping surface of the groove 108r of the periphery rough-machining grindstone 108R. Thereafter, the wafer W is slowly fed to the periphery rough-machining grindstone 108R. Thus, the lower edge of the wafer W is gradually chamfered by the periphery rough-machining grindstone 108R as shown in FIG. 19(a).

The wafer W is fed until the distance between the centers of the periphery rough-machining grindstone 108R and the wafer table 100 reaches a predetermined distance $L_1$. The Y-axis motor 64 is stopped when the distance between the centers of the periphery rough-machining grindstone 108R and the wafer table 100 reaches the predetermined distance $L_1$. Then, the Y-axis motor 64 is run in the opposite direction so that the wafer W can move along the Y-axis away from the periphery rough-machining grindstone 108R. The Y-axis motor 64 is stopped when the wafer W returns to the lower edge rough-machining position.

That completes the rough-chamfering for the lower edge of the wafer W. Then, the upper edge of the wafer W is roughly chamfered.

When the wafer W is positioned at the lower edge rough-machining position, the Z-axis motor 94 is run to move the wafer table 100 up along the Z-axis by a predetermined amount, so that the wafer W held on the wafer table 100 is positioned at the same height as the upper sloping surface of the groove 108r of the periphery rough-machining grindstone 108R. The position of the wafer W at this time will hereafter be referred to as an "upper edge rough-machining position."

Then, the Y-axis motor 64 is run to move the wafer W along the Y-axis toward the periphery rough-machining grindstone 108R. At this time, the wafer W is moved at a high speed until just before it comes into contact with the periphery rough-machining grindstone 108R, and then, the wafer W is moved slowly.

Figure 19B:
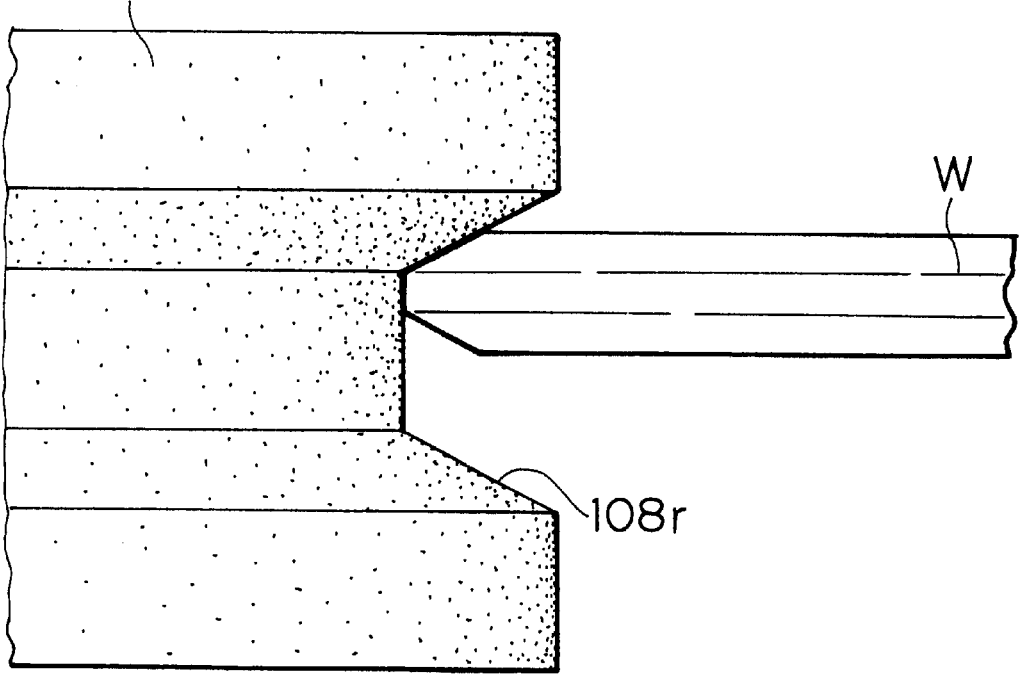

The periphery of the wafer W comes into contact with the upper sloping surface of the groove 108r of the periphery rough-machining grindstone 108R. Thereafter, the wafer W is slowly fed to the periphery rough-machining grindstone 108R. Thus, the upper edge of the wafer W is gradually chamfered by the periphery rough-machining grindstone 108R as shown in FIG. 19(b).

The wafer W is fed until the distance between the centers of the periphery rough-machining grindstone 108R and the wafer table 100 reaches the predetermined distance $L_1$. The Y-axis motor 64 is stopped when the distance between the centers of the periphery rough-machining grindstone 108R and the wafer table 100 reaches the predetermined distance $L_1$. Then, the Y-axis motor 64 is run in the opposite direction so that the wafer W can move along the Y-axis away from the periphery rough-machining grindstone 108R. When the wafer W returns to the upper edge rough-machining position, the Y-axis motor 64 is stopped, and the periphery rough-machining motor 104R is stopped to stop the rotation of the periphery rough-machining grindstone 108R.

That completes the rough-chamfering for the upper edge of the wafer W. Then, the periphery of the wafer W is finely chamfered.

When the wafer W returns to the upper edge rough-machining position, the Z-axis motor 94 is run to move the wafer table 100 along the Z-axis by a predetermined amount, so that the wafer W held on the wafer table 100 is positioned at the same height as the groove 108f of the periphery fine-machining grindstone 108F. The position of the wafer W at this time will hereafter be referred to as an "periphery fine-machining position."

Then, the Y-axis motor 64 is run to move the wafer W along the Y-axis toward the periphery fine-machining grindstone 108F. At this time, the wafer W is moved at a high speed until just before it comes into contact with the periphery fine-machining grindstone 108F, and then, the wafer W is moved slowly.

Figure 20:
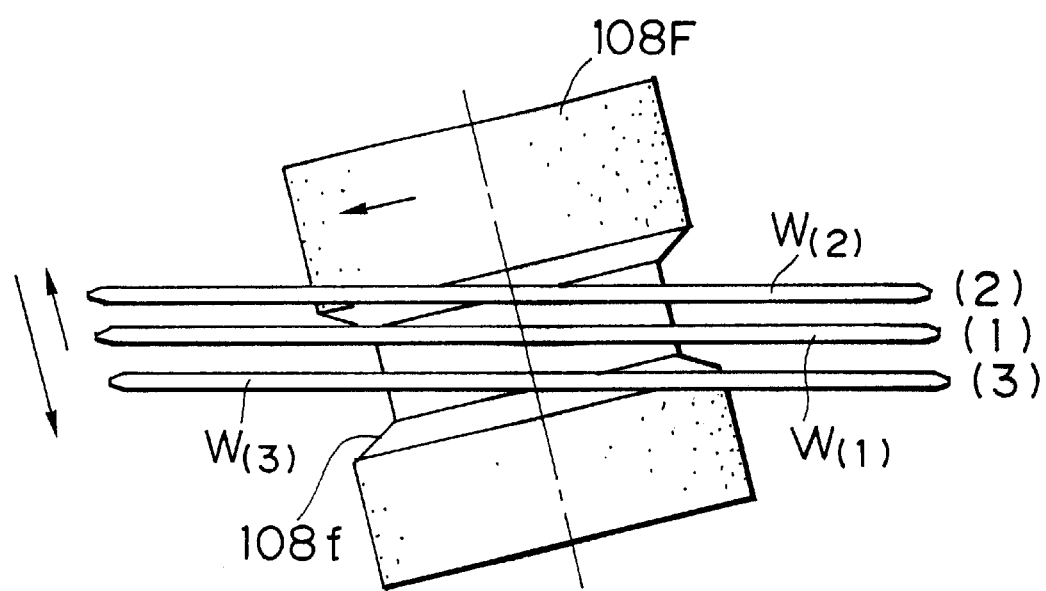
FIG. 20 is an explanation drawing showing the wafer chamfering method according to the seventh embodiment.
Figure 21:
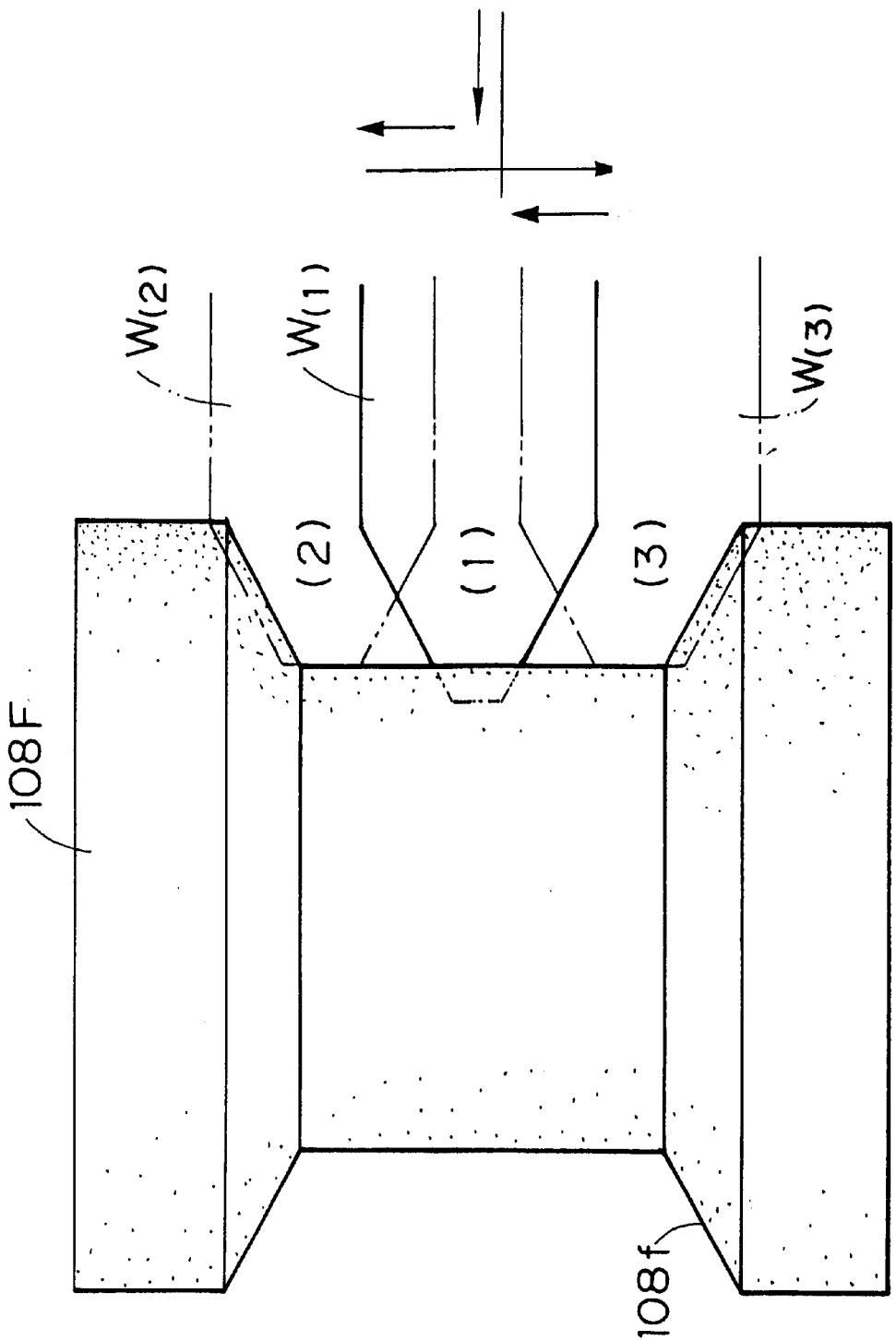
FIG. 21 is an explanation drawing showing the wafer chamfering method according to the seventh embodiment.

As shown in FIGS. 20 and 21, the periphery of the wafer W comes into contact with the center (a position (1) in FIGS. 20 and 21) of the groove 108f of the periphery fine-machining grindstone 108F. Thereafter, the wafer W is slowly fed to the periphery fine-machining grindstone 108F. Thus, the peripheral surface of the wafer W is gradually chamfered by the periphery fine-machining grindstone 108F.

The wafer W is fed until the distance between the centers of the periphery fine-machining grindstone 108F and the wafer table 100 reaches a predetermined distance $L_2$. The Y-axis motor 64 is stopped when the distance between the centers of the periphery fine-machining grindstone 108F and the wafer table 100 reaches the predetermined distance $L_2$.

Then, the Z-axis motor 94 and the X-axis motor 78 are run at the same time, and the wafer W moves up diagonally along the axis of the periphery fine-machining grindstone 108F. Thus, the upper chamfered surface of the wafer W is gradually chamfered by the upper sloping surface of the groove 108f of the periphery fine-machining grindstone 108F.

When the wafer W reaches to a position (2) in FIGS. 20 and 21, the Z-axis motor 94 and the X-axis motor 78 are temporarily stopped. Then, they are run in the opposite direction to move down the wafer W diagonally along the axis of the periphery fine-machining grindstone 108F, so that the lower chamfered surface of the wafer W is gradually chamfered by the lower sloping surface of the groove 108f of the periphery fine-machining grindstone 108F.

When the wafer W reaches to a position (3) in FIGS. 20 and 21, the Z-axis motor 94 and the X-axis motor 78 are temporarily stopped. Then, they are run in the opposite direction to move up the wafer W diagonally along the axis of the periphery fine-machining grindstone 108F. When the wafer W reaches to the position (1) in FIGS. 20 and 21, the Z-axis motor 94 and the X-axis motor 78 are stopped. Then, the Y-axis motor 64 is run to move the wafer W along the Y-axis away from the periphery fine-machining grindstone 108F. When the wafer W returns to the periphery fine-machining position, the Y-axis motor 64 is stopped, and the periphery fine-machining motor 104F and the θ-axis motor 96 are stopped to stop rotating the wafer W. That completes the finish-chamfering for the periphery of the wafer W.

A description will be given of the effects that can be achieved by machining the periphery of the wafer W in the above-mentioned manner, in other words, by roughly chamfering the periphery of the wafer W by the periphery rough-machining grindstone 108R with the large diameter first and then finely chamfering the periphery of the wafer W by the inclined periphery fine-machining grindstone 108F with the small diameter.

Figure 22:
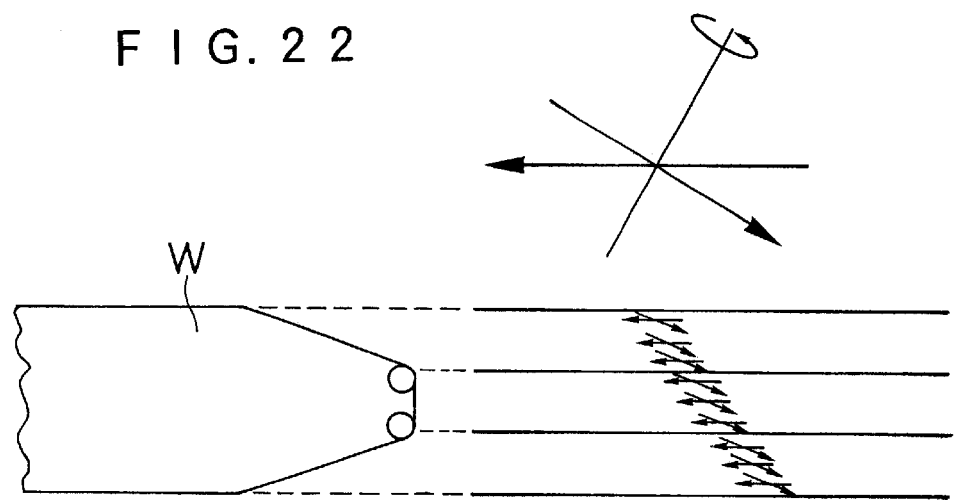
FIG. 22 is an explanation drawing showing the wafer chamfering method according to the seventh embodiment.

The accuracy of the machined surface of the wafer W can be improved by chamfering the wafer W with the grindstone that is inclined at the predetermined angle along the tangential line of the wafer W That is because the moving direction of the abrasive grains on the grindstone is inclined with respect to the rotational direction of the wafer W by inclining the grindstone as shown in FIG. 22. Consequently, the marks on the machined surface of the wafer W caused by the high-speed rotation of the grindstone and the marks on the machined surface of the wafer W caused by the high-speed rotation of the wafer W intersect and offset one another, thus improving the accuracy of the machined surface of the wafer W. Since the grindstone with the small diameter vibrates only a little, the accuracy of the machined surface of the wafer W can be further improved.

The groove formed on the inclined grindstone is wider than the groove formed on the grindstone that is not inclined. When the grindstones are inclined at the same angle, the larger the diameter is, the wider the groove is. If the grindstone has a large diameter, the marks do not intersect one another sufficiently, and the desired effect cannot be achieved. Thus, it is necessary to reduce the diameter of the grindstone in order to achieve the desired effect by inclining the grindstone.

On the other hand, if the grindstone has a small diameter, the grindstone is quickly abraded. In the case of a silicon wafer, the diameter of the wafer just after the slicing is considerably larger (about+1 [mm]) than the diameter of the chamfered wafer, since the parts chipped by the slicing on the wafer must be removed. If the grindstone with a small diameter chamfers the silicon wafer just after the slicing, the grindstone is quickly abraded. Therefore, it is not efficient.

To address this problem, in the present invention, the wafer W is roughly chamfered by the grindstone with the large diameter, which is not easily abraded, until the wafer W is ground to the predetermined diameter. Then, the wafer is finely chamfered by the inclined grindstone with the small diameter. This prevents the abrasion of the inclined grindstone with the small diameter, and makes it possible to improve the accuracy of the machined surface of the wafer W.

After the finish-chamfering for the periphery of the wafer W, the notch NO of the wafer W is chamfered.

When the wafer W returns to the periphery fine-machining position, the notch NO of the wafer W is positioned on the Y-axis. In this state, the X-axis motor 78 is run to move the wafer W along the X-axis by a predetermined amount, so that one of the notch corners NR of the notch NO is positioned on a straight line that goes through the notch rough-machining grindstone 122R and is parallel with the Y-axis. Then, the Z-axis motor 94 is run to move the wafer W along the Z-axis by a predetermined amount, so that the wafer W is positioned at the same height as the lower sloping surface of the groove of the notch rough-machining grindstone 122R. The position of the wafer W at this time will hereafter be referred to as a "notch lower edge rough-machining position."

Then, the notch rough-machining motor 118R is run to rotate the notch rough-machining grindstone 122R at a high speed, and the Y-axis motor 64 is run to move the wafer W toward the notch rough-machining grindstone 122R.

The Y-axis motor 64 is stopped when the wafer W moves by a predetermined distance and the lower edge of the notch corner NR comes into contact with the lower sloping surface of the groove of the notch rough-machining grindstone 122R. Then, the X-axis motor 78 and the Y-axis motor 64 are run to feed the wafer W along the X-axis and the Y-axis so that the lower edge of the notch corner NR can always be in contact with the notch rough-machining grindstone 122R. Thus, the lower edge of the notch corner NR is roughly chamfered.

Then, the wafer W is continuously fed along the X-axis and the Y-axis so that the lower edge of the notch NO can be chamfered. More specifically, the wafer W is fed so that the lower edge of the notch NO can always be in contact with the lower sloping surface of the groove of the notch rough-machining grindstone 122R. In case the notch is V-shaped, the wafer W moves in such a way as to describe the letter V.

After the lower edge of the notch NO is roughly chamfered, the other notch corner NR comes into contact with the notch rough-machining grindstone 122R. Then, the lower edge of the notch corner NR is continuously chamfered. More specifically, the wafer W is fed along the X-axis and the Y-axis so that the lower edge of the notch corner NR can always be in contact with the lower inclined surface of the groove of the notch rough-machining grindstone 122R. Thus, the lower edge of the other notch corner NR is roughly chamfered.

After the lower edge of the other notch corner NR is chamfered, the wafer W is temporarily stopped and is then fed in the reverse operation so that the notch corners NR and the notch NO can be roughly chamfered sequentially.

The above-mentioned operation is repeated multiple times to roughly chamfer the lower edges of the notch NO and the notch corners NR.

After the chamfering for the lower edges of the notch NO and the notch corners NR, the wafer W stops at the position where the wafer W comes into contact with the notch rough-machining grindstone 122R for the first time. Then, the wafer W moves by a predetermined amount away from the notch rough-machining grindstone 122R to return to the notch lower edge rough-machining position. When the wafer W returns to the notch lower edge rough-machining position, the Z-axis motor 94 is run to move the wafer W along the Z-axis by a predetermined amount, so that the wafer W is positioned at the same height as the upper sloping surface of the groove formed in the notch rough-machining grindstone 122R. The position of the wafer W at this time will hereafter be referred to as a "notch upper edge rough-machining position."

Then, the Y-axis motor 64 is run to move the wafer W toward the notch rough-machining grindstone 122R. The Y-axis motor 64 is stopped when the wafer W moves by a predetermined distance and the upper edge of one notch corner NR comes into contact with the upper sloping surface of the groove formed in the notch rough-machining grindstone 122R. Thereafter, the upper edges of the notch NO and the notch corners NR are chamfered in the same procedure as in the rough-chamfering for the lower edge of the notch.

After the rough-chamfering for the upper edges of the notch NO and the notch corners NR, the wafer W stops at the position where it comes into contact with the notch rough-machining grindstone 122R for the first time. Then, the wafer W moves by a predetermined amount away from the notch machining grindstone 122R to return to the notch upper edge rough-machining position. When the wafer W returns to the notch upper edge rough-machining position, the notch rough-machining motor 118R is stopped to stop the rotation of the notch rough-machining grindstone 122R. That completes the rough-chamfering for the notch NO of the wafer W.

Then, the notch NO of the wafer W is finely chamfered. When the wafer W returns to the notch upper edge rough-machining position, the X-axis motor 78 is run to move the wafer W along the X-axis by a predetermined amount, so that one of the notch corners NR of the notch NO formed in the wafer W is positioned on the straight line that goes through the center of the fine-machining grindstone 122F and is parallel with the Y-axis. Then, the Z-axis motor 94 is run to move the wafer W along the Z-axis by a predetermined amount, so that the wafer W is positioned at the same height as the lower sloping surface of the groove formed in the notch fine-machining grindstone 122F. The position of the wafer W at this time will hereafter be referred to as a "notch lower edge fine-machining position."

Then, the notch fine-machining motor 118F is run to rotate the notch fine-machining grindstone 122F at a high speed, and the Y-axis motor 64 is run to move the wafer W toward the notch fine-machining grindstone 122F. The Y-axis motor 64 is stopped when the wafer W moves by a predetermined distance and the lower edge of one notch corner NR of the wafer W comes into contact with the lower sloping surface of the groove formed in the notch rough-machining grindstone 122R. Thereafter, the lower edges of the notch NO and the notch corners NR are finely chamfered in the same procedure as in the rough-chamfering for the lower edge of the notch NO.

After the lower edges of the notch NO and the notch corners NR are finely chamfered, the wafer W stops at the position where it comes into contact with the notch fine-machining grindstone 122F for the first time. Then, the wafer W moves by a predetermined amount away from the notch machining grindstone 122F to return to the notch lower edge fine-machining position. Thereafter, the Z-axis motor 94 is run to move the wafer W along the Z-axis by a predetermined amount, so that the wafer W is positioned at the same height as the upper sloping surface of the groove formed in the notch fine-machining grindstone 122F. The position of the wafer W at this time will hereafter be referred to as a "notch upper edge fine-machining position."

Then, the Y-axis motor 64 is run to move the wafer W toward the notch fine-machining grindstone 122E The Y-axis motor 64 is stopped when the wafer W moves by a predetermined amount and the upper edge of one notch corner NR of the wafer W comes into contact with the upper sloping surface of the groove formed in the notch fine-machining grindstone 122E Thereafter, the upper edges of the notch NO and the notch corners NR are finely chamfered in the same procedure as in the rough-chamfering for the lower edge of the notch NO.

After the finish-chamfering for the upper edges of the notch NO and the notch corners NR, the wafer W stops at the position where it comes into contact with the notch fine-machining grindstone 122F for the first time. Then, the wafer W moves by a predetermined amount away from the notch rough-machining grindstone 122R to return to the notch upper edge fine-machining position. When the wafer W returns to the notch upper edge fine-machining position, the notch fine-machining motor 118F is stopped to stop the rotation of the notch fine-machining grindstone 122F, and the X-axis motor 78 and the Z-axis motor 94 are run to move the wafer table 100 to the original position.

That completes the rough-chamfering and the finish-chamfering for the periphery and the notch of the wafer W. When the wafer table 100 returns to the original position, the wafer table 100 relieves the wafer W of the suction. The transfer apparatus (not shown) picks up the wafer W from the wafer table 100, and transfers the wafer W to the next stage as it is.

As stated above, in the seventh embodiment of the wafer chamfering method, the periphery of the wafer W is roughly chamfered to a predetermined diameter by the grindstone with the large diameter, which is abraded only a little. Then, the periphery of the wafer W is finely chamfered by the inclined grindstone with the small diameter. This prevents the abrasion of the grindstones, and improves the accuracy of the machined surface of the wafer W. The use of the grindstone with the small diameter improves the accuracy of the machined surface of the wafer W since the grindstone with the small diameter hardly vibrates.

In the above explanation, the periphery of the wafer W is chamfered while the wafer W is rotated at a high speed. However, the wafer W may also be rotated at a low speed in the seventh embodiment unlike the first through sixth embodiments.

In the seventh embodiment, the type of the grindstone is not particularly restricted, but it is desirable to use a metal-bond grindstone as the periphery rough-machining grindstone 108R with the large diameter, and use a resin-bond grindstone as the inclined periphery fine-machining grindstone 108F with the small diameter for the reasons stated below.

The metal-bond grindstone has a long life since it is stiff and is capable of holding abrasive grains for a long time. The metal-bond grindstone, however, cannot finely grind the machined surface of the wafer W. On the other hand, the resin-bond grindstone is elastic and hardly shocks the machined surface of the wafer W, thus improving the accuracy of the machined surface of the wafer W. Hence, it is preferable that the metal-bond grindstone, which is little abraded and has a long life, roughly chamfers the wafer W first, and then, the resin-bond grindstone finely chamfers the wafer W. This prevents the abrasion of the fine-machining grindstone and makes it possible to efficiently and accurately chamfer the wafer W. For these reasons, the metal-bond grindstone is used as the periphery rough-machining grindstone 108R, and the resin-bond grindstone is used as the periphery fine-machining grindstone 108F.

Although the resin-bond grindstone is easily abraded, using the resin-bond grindstone as the inclined periphery fine-machining grindstone with the small diameter eliminates the necessity of truing the grindstone for the reasons stated below. The grindstone with the small diameter is easily and uniformly abraded since it has a short circumference. Moreover, the inclination of the grindstone increases the area where the grindstone is in contact with the wafer W. This reduces the sectional load and achieves the uniform abrasion. In addition, the fine-machining grindstone is used to chamfer the wafer W that has already been shaped in the rough-chamfering into the opposite shape of the fine-machining grindstone, and thus, the wafer W itself serves as a truer for the fine-machining grindstone. Therefore, it is possible to maintain the shape of the resin-bond grindstone as the inclined periphery fine-machining grindstone without truing the grindstone expressly.

It is possible to improve the maintaining of the shape of the fine-machining grindstone by finely chamfering the wafer W in a method described below. In the seventh embodiment, (1) the peripheral surface of the wafer W is finely chamfered; (2) the wafer W is fed upward so that the upper chamfered surface thereof can be finely chamfered; and (3) the wafer W is fed downward so that the lower chamfered surface thereof can be finely chamfered as shown in FIGS. 20 and 21. In order to chamfer the next or the second wafer W, the steps (2) and (3) are reversed (i.e., the order of (1)→(3)→(2)). The third wafer W is chamfered in the order of (1)→(2)→(3) as the first wafer W. Thereby, the chamfered surface to be finely chamfered first is changed, so that the upper sloping surface and the lower sloping surface of the groove formed in the grindstone are uniformly abraded. Thus, the shape of the grindstone can be maintained.

Figure 23:
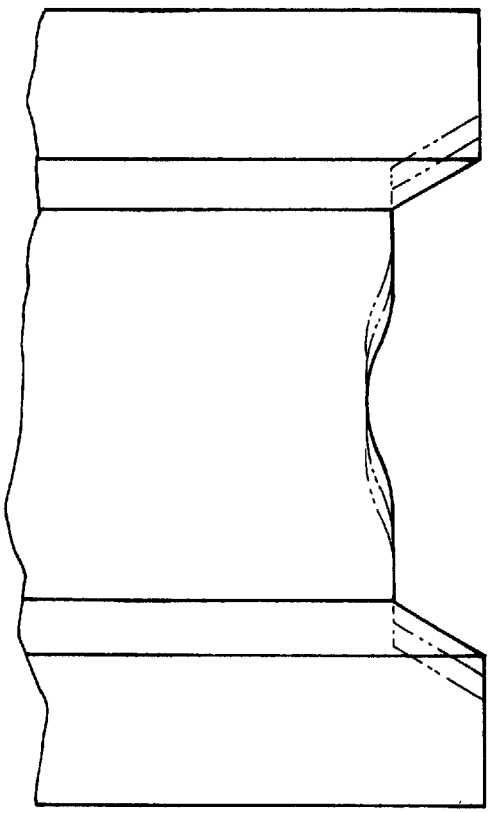
FIG. 23 is an explanation drawing showing abrasion of a grindstone.

The repetition of the machining process gradually abrades the grindstone as shown in FIG. 23. Thus, the chamfering position is shifted according to the abrasion of the groove. More specifically, the chamfering start position for the peripheral surface of the wafer W and the chamfering end position for the upper chamfered surface and the lower chamfered surface of the wafer W are gradually shifted during the repetition. It is therefore possible to machine the wafers W while maintaining the high accuracy of the machined surfaces of the wafers W.

The abraded amount of the groove can be found by measuring the thickness of the wafer W before the machining, and measuring the diameter of the chamfered wafer W and the width of the chamfered surfaces. In other words, the abraded amount of the groove is found according to the difference between the actual size of the chamfered wafer W and a desired size for the chamfered wafer W. The machining position is corrected according to the abraded amount of the groove.

A description will be given of the eighth embodiment of the wafer chamfering method according to the present invention.

In the eighth embodiment, the resin-bond grindstone is used as the periphery fine-machining grindstone 108F, and the shape of the grindstone can be maintained.

The eighth embodiment of the wafer chamfering method is different from the seventh embodiment only in the step of finely chamfering the periphery of the wafer W. Then, a description will now be given only of the step of finely chamfering the periphery of the wafer W.

As shown in FIG. 24, both ends of the groove 108$f$ of the periphery fine-machining grindstone 108F in this embodiment is arc-shaped with the same radius of curvature R as the end of the wafer W after chamfering (see FIGS. 25($a$) and 25($b$)).

When the wafer W held on the wafer table 100 is positioned at the periphery fine-machining position, the Y-axis motor 64 is run to move the wafer W toward the periphery fine-machining grindstone 108F. A peripheral surface $w_1$ of the wafer W comes into contact with nearly the center (the position (1) in FIG. 24) of a flat surface 108$f_1$ of the groove 108$f$ formed in the periphery fine-machining grindstone 108F. Thereafter, the wafer W is slowly fed to the periphery fine-machining grindstone 108F. The Y-axis motor 64 is stopped when the distance between the centers of the periphery fine-machining grindstone 108F and the wafer table 100 reaches a predetermined distance $L_2$.

Then, the Z-axis motor 94 and the X-axis motor 78 are run at the same time to move up the wafer W diagonally along the axis of the periphery fine-machining grindstone 108F. Thus, the peripheral surface $w_1$ of the wafer W is finely chamfered by the flat surface 108$f_1$ of the groove 108$f$ formed in the periphery fine-machining grindstone 108F. The Z-axis motor 94 and the X-axis motor 78 are stopped when the wafer W moves by a predetermined distance and an upper chamfered surface $w_2$ of the wafer W comes into contact with an upper sloping surface 108$f_2$ of the groove 108$f$ formed in the periphery fine-machining grindstone 108F (the state (2) in FIG. 24).

Then, the Z-axis motor 94, the X-axis motor 78 and the Y-axis motor 64 are run at the same time to move up the wafer W diagonally along the upper sloping surface 108$f_2$ of the groove 108f formed in the periphery fine-machining grindstone 108F. Thus, the upper chamfered surface $w_2$ of the wafer W is chamfered by the upper sloping surface $108f_2$ of the groove 108f formed in the periphery fine-machining grindstone 108F.

The Z-axis motor 94, the X-axis motor 78 and the Y-axis motor 64 are stopped temporarily when the wafer W moves by a predetermined distance and an upper corner $W_3$ of the peripheral surface of the wafer W comes into contact with an arc surface $108f_3$ formed at the upper edge of the groove 108f of the periphery fine-machining grindstone 108F (the state (3) in FIG. 24). Then, the Z-axis motor 94, the X-axis motor 78 and the Y-axis motor 64 are run at the same time to move the wafer W along the arc surface $108f_3$, so that the upper corner $w_3$ of the peripheral surface of the wafer W is ground in the form of an arc.

The Z-axis motor 94, the X-axis motor 78 and the Y-axis motor 64 are temporarily stopped when the upper corner $W_3$ of the peripheral surface of the wafer W is ground in the form of the arc (the state (4) in FIG. 24). Then, the Z-axis motor 94 and the X-axis motor 78 are run at the same time to move down the wafer W diagonally along the axis of the periphery fine-machining grindstone 108F. The Z-axis motor 94 and the X-axis motor 78 are stopped when the wafer W is positioned almost at the center of the flat surface $108f_1$ of the groove 108f formed in the grindstone 108F. Then, the Y-axis motor 64 is run to move the wafer W along the Y-axis toward the flat surface $108f_1$ of the groove 108f formed in the grindstone 108F, so that the peripheral surface $w_1$ of the wafer W comes into contact with almost the center of the flat surface $108f_1$ of the groove 108f formed in the grindstone 108F (the position (5) in FIG. 24 (the same position as (1)). Thereafter, the wafer W is slowly fed to the periphery fine-machining grindstone 108F.

The Y-axis motor 64 is stopped when the distance between the centers of the periphery fine-machining grindstone 108F and the wafer table 100 reaches the predetermined distance $L_2$. Then, the Z-axis motor 94 and the X-axis motor 78 are run at the same time to move down the wafer W diagonally along the axis of the periphery fine-machining grindstone 108F. Thus, the peripheral surface $w_1$ of the wafer W is finely chamfered by the flat surface $108f_1$ of the groove 108f formed in the grindstone 108F.

The Z-axis motor 94 and the X-axis motor 78 are temporarily stopped when the wafer W moves by a predetermined distance and a lower chamfered surface $w_4$ of the wafer W comes into contact with a lower sloping surface $108f_4$ of the groove 108f formed in the periphery fine-machining grindstone 108F (the state (6) in FIG. 24). Then, the Z-axis motor 94, the X-axis motor 78 and the Y-axis motor 64 are run at the same time to move down the wafer W diagonally along the lower sloping surface $108f_4$ of the groove 108f formed in the periphery fine-machining grindstone 108F. Thus, the lower chamfered surface $w_4$ of the wafer W is finely chamfered by the lower sloping surface $108f_4$ of the groove 108f formed in the periphery fine-machining grindstone 108F.

The Z-axis motor 94, the X-axis motor 78 and the Y-axis motor 64 are temporarily stopped when the wafer W moves by a predetermined distance and a lower corner $w_5$ of the peripheral surface of the wafer W comes into contact with an arc surface $108f_5$ formed at the lower edge of the groove 108f of the periphery fine-machining grindstone 108F (the state (7) in FIG. 24). Then, the Z-axis motor 94, the X-axis motor 78 and the Y-axis motor 64 are run at the same time to move the wafer W along the arc surface $108f_5$, so that the lower corner $w_5$ of the peripheral surface of the wafer W is ground in the form of an arc.

The Z-axis motor 94, the X-axis motor 78 and the Y-axis motor 64 are stopped when the lower corner $w_5$ of the peripheral surface of the wafer W is ground in the form of the arc (the state (8) in FIG. 24). That completes the finish-chamfering for the periphery of the wafer W, and the wafer W returns to the periphery fine-machining position.

Thereby, the groove 108f of the periphery fine-machining grindstone 108F is uniformly abraded. Thus, the shape of the periphery fine-machining grindstone 108F can be maintained even if the machining is repeated. This eliminates the necessity of truing the grindstone, and prevents the decrease in the throughput due to the truing.

As is the case with the seventh embodiment, the surfaces to be chamfered first (the upper chamfered surface $w_2$ or the lower chamfered surface $W_4$) are changed alternately. This prevents a change in the shape of the periphery fine-machining grindstone 108F.

As set forth hereinabove, it is possible to accurately chamfer the wafer in a short period in the wafer chamfering method according to the present invention.

In the first through sixth embodiments, the formed grindstone is used, but it is also possible to use the T-shaped grindstone as is the case with the seventh embodiment. Likewise, it is possible to use the formed grindstone instead of the T-shaped grindstone in the seventh embodiment.

In the first through fifth embodiments, the grindstone and the wafer are rotated at high speeds in the same direction, but they may also be rotated at high speeds in opposite directions. Even if they are rotated in opposite directions, the same effects can be achieved if they are rotated at high speeds. In addition, the accuracy of the machined surface of the wafer can be improved, and the chipping of the wafer can be prevented.

Figure 25A:
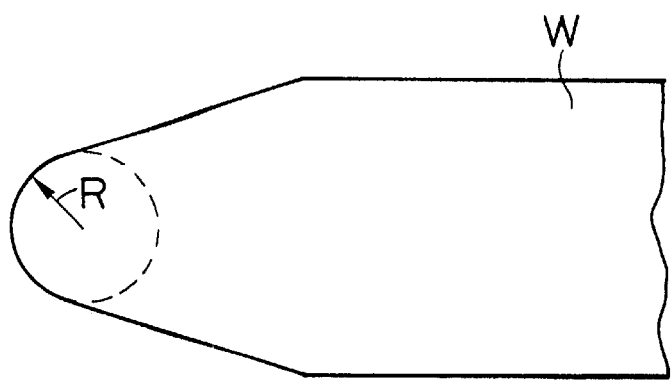
FIGS. 25(a) and 25(b) are sectional views showing chamfered wafers.
Figure 25B:
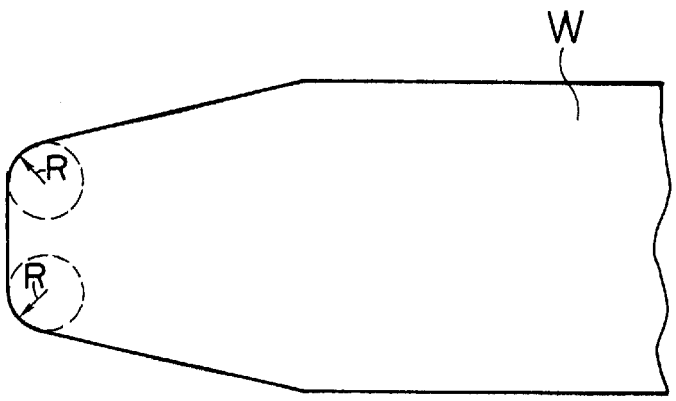

According to the present invention, the wafer may be chamfered to two kinds of sectional shapes in FIGS. 25(a) and 25(b). Both kinds of the sectional shapes can be applied to the present invention.

As set forth hereinabove, it is possible to accurately chamfer the wafer in the wafer chamfering method according to the present invention.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wafer chamfering method comprising the steps of:
   rotating a grindstone and a wafer at high speeds;
   getting the grindstone and the wafer closer to each other including getting the grindstone and the wafer closer to each by a predetermined distance and stopping to get the grindstone and the wafer closer to each other for a predetermined period, thereby gradually chamfering a periphery of the wafer by the grindstone,
   wherein the step of getting the grindstone and the wafer closer to each other is repeated.

2. The wafer chamfering method as defined in claim 1, wherein, in the rotating step, the grindstone is rotated at a circumferential speed of at least 1,000 m/min, and the wafer is rotated at a circumferential speed of at least 30 m/min.

3. The wafer chamfering method as defined in claim 1, further comprising the step of:

rotating the wafer at a low speed to finely chamfer the periphery of the wafer, after the periphery of the wafer is chamfered by a predetermined amount.

4. The wafer chamfering method as defined in claim 3, wherein, in the step of rotating the wafer at the low speed, the wafer is rotated at a circumferential speed of between 0.3 m/min and 3 m/min.

5. The wafer chamfering method as defined in claim 1, wherein at least one of a circumferential speed of the wafer and a circumferential speed of the grindstone is periodically changed within a range of a high speed.

6. The wafer chamfering method as defined in claim 1, wherein at least one of a rotating direction of the wafer and a rotating direction of the grindstone is periodically changed.

7. The wafer chamfering method as defined in claim 6, wherein the wafer and the grindstone are stopped being got closer to each other while at least one of the rotating direction of the wafer and the rotating direction of the grindstone is being changed.

8. A wafer chamfering method comprising the steps of:
arranging a grindstone and a wafer separately on two parallel straight lines with a predetermined interval;
rotating the grindstone and the wafer at high speeds;
moving at least one of the wafer and the grindstone on the straight line to bring the grindstone into contact with a periphery of the wafer including getting the grindstone and the wafer closer to each by a predetermined distance and stopping to get the grindstone and the wafer closer to each other for a predetermined period, thereby gradually chamfering the periphery of the wafer by the grindstone,
wherein the step of moving at least one of the wafer and the grindstone is repeated.

9. The wafer chamfering method as defined in claim 8, wherein the predetermined interval between the two straight lines is the sum of a radius of the grindstone and a radius of the wafer after the chamfering.

10. The wafer chamfering method as defined in claim 8, wherein, in the rotating step, the grindstone is rotated at a circumferential speed of at least 1,000 m/min, and the wafer is rotated at a circumferential speed of at least 30 m/min.

11. The wafer chamfering method as defined in claim 8, further comprising the step of:
rotating the wafer at a low speed to finely chamfer the periphery of the wafer, after the periphery of the wafer is chamfered by a predetermined amount.

12. The wafer chamfering method as defined in claim 11, wherein, in the step of rotating the wafer at the low speed, the wafer is rotated at a circumferential speed of between 0.3 m/min and 3 m/min.

13. The wafer chamfering method as defined in claim 8, wherein at least one of a circumferential speed of the wafer and a circumferential speed of the grindstone is periodically changed within a range of a high speed.

14. The wafer chamfering method as defined in claim 8, wherein at least one of a rotating direction of the wafer and a rotating direction of the grindstone is periodically changed.

15. The wafer chamfering method as defined in claim 14, wherein the wafer and the grindstone are stopped being got closer to each other while at least one of the rotating direction of the wafer and the rotating direction of the grindstone is being changed.

16. A wafer chamfering method, comprising the steps of:
roughly chamfering a periphery of a rotating wafer by a first rotating grindstone with a large diameter by getting the rotating wafer and the first rotating grindstone closer to each other; and
finely chamfering the periphery of the rotating wafer by a second rotating grindstone with a small diameter by getting the rotating wafer and the second rotating grindstone closer to each other.

17. The wafer chamfering method as defined in claim 16, wherein the first rotating grindstone has a diameter of between 100 mm and 300 mm, and the second rotating grindstone has a diameter of between 2 mm and 50 mm.

18. The wafer chamfering method as defined in claim 16, wherein the second grindstone is a resin-bond grindstone.

19. The wafer chamfering method as defined in claim 16, wherein the second grindstone has a groove of a trapezoidal section at a periphery thereof, and is inclined at a predetermined angle along a tangent line of the rotating wafer.

20. The wafer chamfering method as defined in claim 19, wherein:
the groove at the periphery of the second grindstone has first and second arc surfaces at both edges thereof, respectively; and
the finely chamfering step comprises the steps of:
bringing the peripheral surface of the rotating wafer into contact with a flat surface of the groove of the second grindstone;
moving the rotating wafer along the flat surface of the groove of the second grindstone to thereby bring a first chamfered surface of the periphery of the rotating wafer into contact with a first sloping surface of the groove of the second grindstone;
moving the rotating wafer along the first sloping surface and the first arc surface of the groove of the second grindstone to grind a first corner of the peripheral surface of the rotating wafer;
bringing the peripheral surface of the rotating wafer into contact with the flat surface of the groove of the second grindstone;
moving the wafer along the flat surface of the groove of the second grindstone to thereby bring a second chamfered surface of the periphery of the rotating wafer into contact with a second sloping surface of the groove of the second grindstone; and
moving the rotating wafer along the second sloping surface and the second arc surface of the groove of the second grindstone to grind a second corner of the peripheral surface of the rotating wafer.

21. The wafer chamfering method as defined in claim 20, wherein:
the first corner of the peripheral surface of the rotating wafer is ground at the same curvature as the first arc surface of the groove of the second grindstone; and
the second corner of the peripheral surface of the rotating wafer is ground at the same curvature as the second arc surface of the groove of the second grindstone.

* * * * *